(12) United States Patent
Wang

(10) Patent No.: US 11,880,115 B2
(45) Date of Patent: *Jan. 23, 2024

(54) CLOCK GENERATION FOR A PHOTONIC QUANTUM COMPUTER COMPRISING A PHOTON-PAIR SOURCE TO CONVERT THE CONVERTED ELECTRICAL PULSES INTO A PLURALITY OF CLOCK SIGNALS AT A FIRST REPETITION RATE

(71) Applicant: Psiquantum, Corp., Palo Alto, CA (US)

(72) Inventor: Albert Wang, Sunnyvale, CA (US)

(73) Assignee: Psiquantum, Corp., Palo Alto, CA (US)

(*) Notice: Subject to any disclaimer, the term of this patent is extended or adjusted under 35 U.S.C. 154(b) by 147 days.

This patent is subject to a terminal disclaimer.

(21) Appl. No.: 17/481,045

(22) Filed: Sep. 21, 2021

(65) Prior Publication Data

US 2022/0004079 A1    Jan. 6, 2022

Related U.S. Application Data

(63) Continuation of application No. PCT/US2019/038314, filed on Jun. 20, 2019, which
(Continued)

(51) Int. Cl.
*G01J 1/44*    (2006.01)
*G02F 1/35*    (2006.01)
(Continued)

(52) U.S. Cl.
CPC .......... *G02F 1/3526* (2013.01); *G01J 1/0488* (2013.01); *G01J 1/44* (2013.01);
(Continued)

(58) Field of Classification Search
CPC ....... G01J 1/04; G01J 1/02; G01J 1/44; G02F 1/35; G02F 3/02; G02F 1/39; G06F 1/06;
(Continued)

(56) References Cited

U.S. PATENT DOCUMENTS 6,819,428 B2 * 11/2004 Ogawa ................ G01J 11/00
                                                356/450
8,811,829 B2   8/2014 Yuan et al.
(Continued)

FOREIGN PATENT DOCUMENTS

CN    106842766 A    6/2017
EP    1091240 A1    4/2001

OTHER PUBLICATIONS

PCT/US2019/038314, "International Search Report and Written Opinion", dated Jul. 26, 2019, 6 pages.
(Continued)

*Primary Examiner* — Que Tan Le
(74) *Attorney, Agent, or Firm* — Kilpatrick Townsend & Stockton LLP

(57) ABSTRACT

A system for generating clock signals for a photonic quantum computing system includes a pump photon source configured to generate a plurality of pump photon pulses at a first repetition rate, a waveguide optically coupled to the pump photon source, and a photon-pair source optically coupled to the first waveguide. The system also includes a photodetector optically coupled to the photon-pair source and configured to generate a plurality of electrical pulses in response to detection of at least a portion of the plurality of pump photon pulses at the first repetition rate and a clock generator coupled to the photodetector and configured to convert the plurality of electrical pulses into a plurality of clock signals at the first repetition rate.

20 Claims, 14 Drawing Sheets

Related U.S. Application Data is a continuation of application No. 16/362,452, filed on Mar. 22, 2019, now Pat. No. 10,379,420.

(51) Int. Cl.
| | |
|---|---|
| *G01J 1/04* | (2006.01) |
| *G06N 10/00* | (2022.01) |
| *G06F 1/06* | (2006.01) |
| *H03K 3/38* | (2006.01) |
| *H03K 3/42* | (2006.01) |
| *G01J 1/42* | (2006.01) |

(52) U.S. Cl.
CPC ............... *G06F 1/06* (2013.01); *G06N 10/00* (2019.01); *H03K 3/38* (2013.01); *H03K 3/42* (2013.01); *G01J 2001/4238* (2013.01); *G01J 2001/4413* (2013.01)

(58) Field of Classification Search
CPC ............ G06N 10/00; H03K 3/00; H03K 3/38; H03K 3/02; H03K 3/42; H03K 3/72
USPC .......................................... 250/214 R, 214.1
See application file for complete search history.

(56) References Cited

U.S. PATENT DOCUMENTS

| | | | |
|---|---|---|---|
| 10,175,554 | B2 | 1/2019 | Grice et al. |
| 11,119,385 | B2 * | 9/2021 | Wang ........................ G01J 1/44 |
| 2012/0294319 | A1 | 11/2012 | Maleki et al. |
| 2013/0003766 | A1 | 1/2013 | Savchenkov et al. |
| 2013/0048845 | A1 | 2/2013 | Senellart et al. |
| 2013/0215918 | A1 | 8/2013 | Wilkinson et al. |
| 2014/0028405 | A1 | 1/2014 | Hong |
| 2014/0193155 | A1 | 7/2014 | Popovic et al. |
| 2017/0075190 | A1 | 3/2017 | Rudolph et al. |
| 2017/0261770 | A1 | 9/2017 | Bishop et al. |
| 2018/0231868 | A1 | 8/2018 | Grice et al. |

OTHER PUBLICATIONS

Collins, et al., "Spatial Multiplexing of Monolithic Silicon Heralded Single Photon Sources", 2013 Conference on Lasers & Electro-Optics, Europe & International Quantum Electronics Conference Cleo Europe/IQEC, IEEE, 2013, 1 page.

EP19922097.1, "Extended European Search Report", dated Dec. 19, 2022, 8 pages.

PCT/US2019/038314, "International Preliminary Report on Patentability", dated Oct. 7, 2021, 5 pages.

* cited by examiner

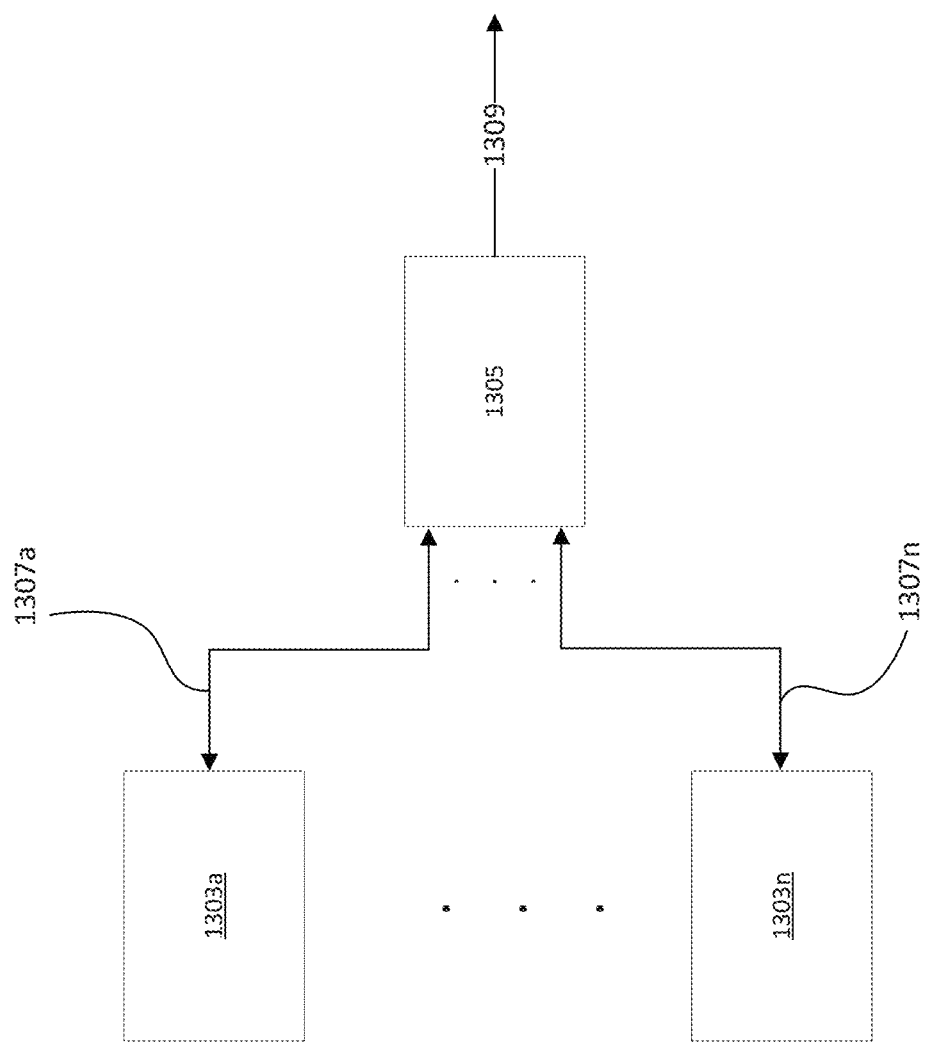

CLOCK GENERATION FOR A PHOTONIC QUANTUM COMPUTER COMPRISING A PHOTON-PAIR SOURCE TO CONVERT THE CONVERTED ELECTRICAL PULSES INTO A PLURALITY OF CLOCK SIGNALS AT A FIRST REPETITION RATE

CROSS REFERENCE TO RELATED APPLICATION

This application claims priority to and is a continuation of International Patent Application No. PCT/US2019/038314, filed Jun. 20, 2019; which claims priority to U.S. patent application Ser. No. 16/362,452 filed Mar. 22, 2019, now U.S. Pat. No. 10,379,420 issued Aug. 13, 2019, the entire contents of which are hereby incorporated by reference in their entirety for all purposes.

BACKGROUND OF THE INVENTION

A photonic quantum computer, such as a linear optical quantum computer (LOQC), may require the routing of photons through complex photonic circuits that include many optical elements, such as beam splitters, phase shifters, and mirrors. Single-photon sources may be used to generate the photons used as qubits in the quantum computing.

Despite the progress made in photonic quantum computers, there is a need in the art for improved methods and systems related to clock generation.

SUMMARY OF THE INVENTION

According to an embodiment of the present invention, a system for generating clock signals for a photonic quantum computing system disposed inside a cryostat is provided. The system includes a pump photon source disposed outside the cryostat. The pump photon source is configured to generate a plurality of pump photon pulses at a first repetition rate. The system also includes a waveguide optically coupled to the pump photon source and a photon-pair source disposed inside the cryostat and optically coupled to the first waveguide. The photon-pair source is configured to receive the plurality of pump photon pulses via the waveguide, convert a first portion of each of a subset of the plurality of pump photon pulses into a photon pair, output the photon pairs converted from the subset of the plurality of pump photon pulses, and output a second portion of each pump photon pulse of the plurality of pump photon pulses. The system further includes a photodetector disposed inside the cryostat and configured to receive the second portion of each pump photon pulse of the plurality of pump photon pulses generate a plurality of electrical pulses by converting the second portion of each pump photon pulse of the plurality of pump photon pulses into a respective electrical pulse of the plurality of electrical pulses. Moreover, the system includes a clock generator disposed inside the cryostat and electrically coupled to the photodetector. The clock generator is configured to convert the plurality of electrical pulses generated by the photodetector into a plurality of clock signals at the first repetition rate.

According to another embodiment of the present invention, a system for generating clock signals for a photonic quantum computing system is provided. The system includes a pump photon source configured to generate a plurality of pump photon pulses at a first repetition rate, a waveguide optically coupled to the pump photon source, and a photon-pair source optically coupled to the first waveguide. The system also includes a photodetector optically coupled to the photon-pair source and configured to generate a plurality of electrical pulses in response to detection of at least a portion of the plurality of pump photon pulses at the first repetition rate and a clock generator coupled to the photodetector and configured to convert the plurality of electrical pulses into a plurality of clock signals at the first repetition rate. In an embodiment, a second portion of each pump photon pulse of the plurality of pump photon pulses is output by the first waveguide and the photodetector is optically coupled to the first waveguide.

According to an alternative embodiment of the present invention, a method of generating clock signals for a photonic quantum computing system disposed inside a cryostat is provided. The method includes generating, using a pump photon source disposed outside the cryostat, a plurality of pump photon pulses at a first repetition rate, and converting, using a photon-pair source disposed inside the cryostat and optically coupled to the pump photon source via a waveguide, a first portion of each of a subset of the plurality of pump photon pulses into a photon pair. The photon-pair source outputs a second portion of each pump photon pulse of the plurality of pump photon pulses. The method also includes generating, using a photodetector disposed inside the cryostat, a plurality of electrical pulses by converting the second portion of each pump photon pulse of the plurality of pump photon pulses into a respective electrical pulse of the plurality of electrical pulses and generating, using a clock generator disposed inside the cryostat and coupled to the photodetector, a plurality of clock signals at the first repetition rate using the plurality of electrical pulses.

In an embodiment, the photon-pair source, the photodetector, the clock generator, and the photonic quantum computing system are disposed on a single chip placed inside the cryostat. The photon pair can include a signal photon and a heralding photon. One of the signal photon or the heralding photon is used by the quantum computing system as a qubit. In an exemplary embodiment, the first portion of each of the subset of the plurality of pump photon pulses is converted into the photon pair non-deterministically.

In an embodiment, the photon-pair source comprises a first waveguide optically coupled to the pump photon source via the waveguide for receiving the plurality of pump photon pulses; a resonator optically coupled to the first waveguide and comprising a nonlinear optical material; and a second waveguide optically coupled to the resonator. The resonator can include one or more ring resonators. In this embodiment, the method further comprises coupling a portion of each pump photon pulse of the plurality of pump photon pulses from the first waveguide into the resonator. The first portion of each of the subset of the plurality of pump photon pulses that is converted into the photon pair is among the portion and is converted by the nonlinear optical material of the resonator. The method also includes coupling the photon pairs converted from the subset of the plurality of pump photon pulses by the resonator into the second waveguide.

In another embodiment, the second portion of each pump photon pulse of the plurality of pump photon pulses is among the portion and the method further comprises coupling the second portion of each pump photon pulse of the plurality of pump photon pulses from the resonator into the second waveguide. In some embodiment, the method also includes separating, using a pump rejecter disposed inside the cryostat and optically coupled to the second waveguide, the second portion of each pump photon pulse of the plurality of pump photon pulses from the photon pairs and coupling the second portion of each pump photon pulse of the plurality of pump photon pulses into the photodetector to be converted into the plurality of electrical pulses. As an example, the pump rejecter can include a spectral filter.

In yet another embodiment, the second portion of each pump photon pulse of the plurality of pump photon pulses is among a remaining portion of each pump photon pulse of the plurality of pump photon pulses that is not coupled into the resonator, In this embodiment, the method further includes coupling the second portion of each pump photon pulse of the plurality of pump photon pulses from the first waveguide into the photodetector to be converted into the plurality of electrical pulses.

BRIEF DESCRIPTION OF THE DRAWINGS

FIG. 13 is a simplified schematic diagram illustrating generation of a clock signal in conjunction with two or more photon-pair sources.

DETAILED DESCRIPTION OF SPECIFIC EMBODIMENTS

In some photonic quantum computers, the various optical elements may be remote from one another, and yet need to be operated with very precise timing. To achieve precise timing control, an accurate system clock may be required. Thus, embodiments of the present invention provide systems and methods of generating clock signals for a photonic quantum computing system.

A photonic quantum computer, e.g., such as the systems shown in FIGS. 1A-1B below, may require an accurate system clock to control the timing of the operations of various optical elements. The system clock may need to have characteristics such as low phase noise, small drift, and the like, for achieving high performance of the photonic quantum computer. The system clock may be set according to the photon generation rate of the single-photon sources. While one may desire to recover the system clock from the photon stream in a manner analogous to classical clock recovery from a data stream, this option is not available for a photonic quantum computer, because doing so would require the measurement and thus destruction of the same photons that are used to perform the quantum computing (i.e., the photonic qubits). Thus, generating an accurate clock for a photonic quantum computer may pose particular challenges.

Figure 1A:
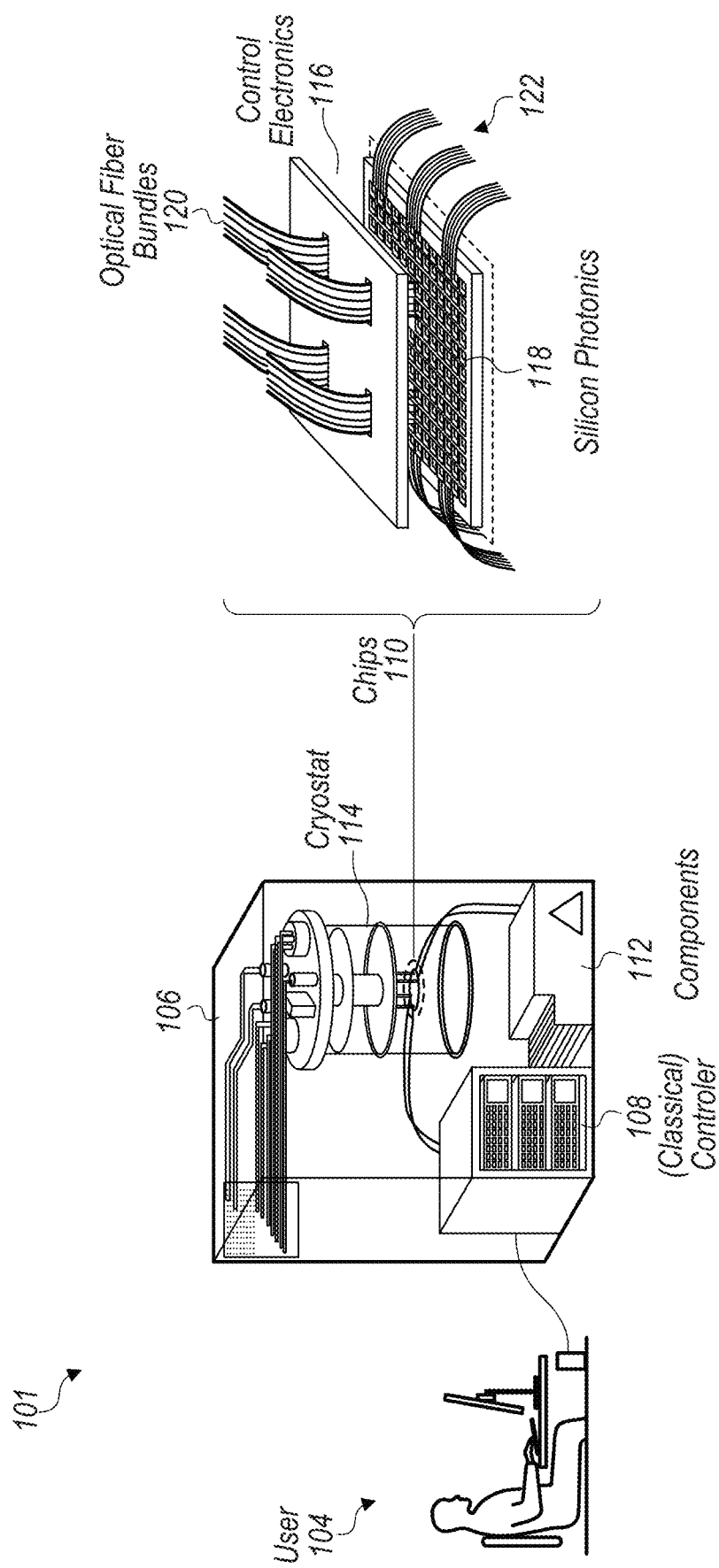
FIG. 1A shows a hybrid computing system in accordance with one or more embodiments.

FIG. 1A shows a hybrid computing system in accordance with one or more embodiments. The hybrid computing system 101 includes a user interface device 104 that is communicatively coupled to a hybrid quantum computing (QC) sub-system 106, described in more detail below in FIG. 1B. The user interface device 104 can be any type of user interface device, e.g., a terminal including a display, keyboard, mouse, touchscreen and the like. In addition, the user interface device can itself be a computer such as a personal computer (PC), laptop, tablet computer and the like. In some embodiments, the user interface device 104 provides an interface with which a user can interact with the hybrid QC subsystem 106. For example, the user interface device 104 may run software, such as a text editor, an interactive development environment (IDE), command prompt, graphical user interface, and the like so that the user can program, or otherwise interact with, the QC subsystem to run one or more quantum algorithms. In other embodiments, the hybrid QC subsystem 106 may be pre-programmed and the user interface device 104 may simply be an interface where a user can initiate a quantum computation, monitor the progress, and receive results from the hybrid QC subsystem 106. Hybrid QC subsystem 106 further includes a classical computing system 108 coupled to one or more quantum computing chips 110. In some examples, the classical computing system 108 and the quantum computing chips 110 can be coupled to other electronic and/or optical components 112, e.g., pulsed pump lasers, microwave oscillators, power supplies, networking hardware, etc. In some embodiments that require cryogenic operation, the quantum computing chips 110 can be housed within a cryostat, e.g., cryostat 114. On other embodiments where cryogenic operation is not required, the quantum computing chips 110, the cryostat 114 may be replaced with any other enclosure. In some embodiments, the quantum computing chips 110 can include one or more constituent chips, e.g., hybrid control electronics 116 and integrated photonics chip 118. Signals can be routed on- and off-chip any number of ways, e.g., via optical interconnects 120 and via other electronic interconnects 122. In addition, the hybrid computing system 101 may employ a quantum computing process, e.g., measurement-based quantum computing (MBQC), circuit-based quantum computing (CBQC) or any other quantum computing scheme.

Figure 1B:
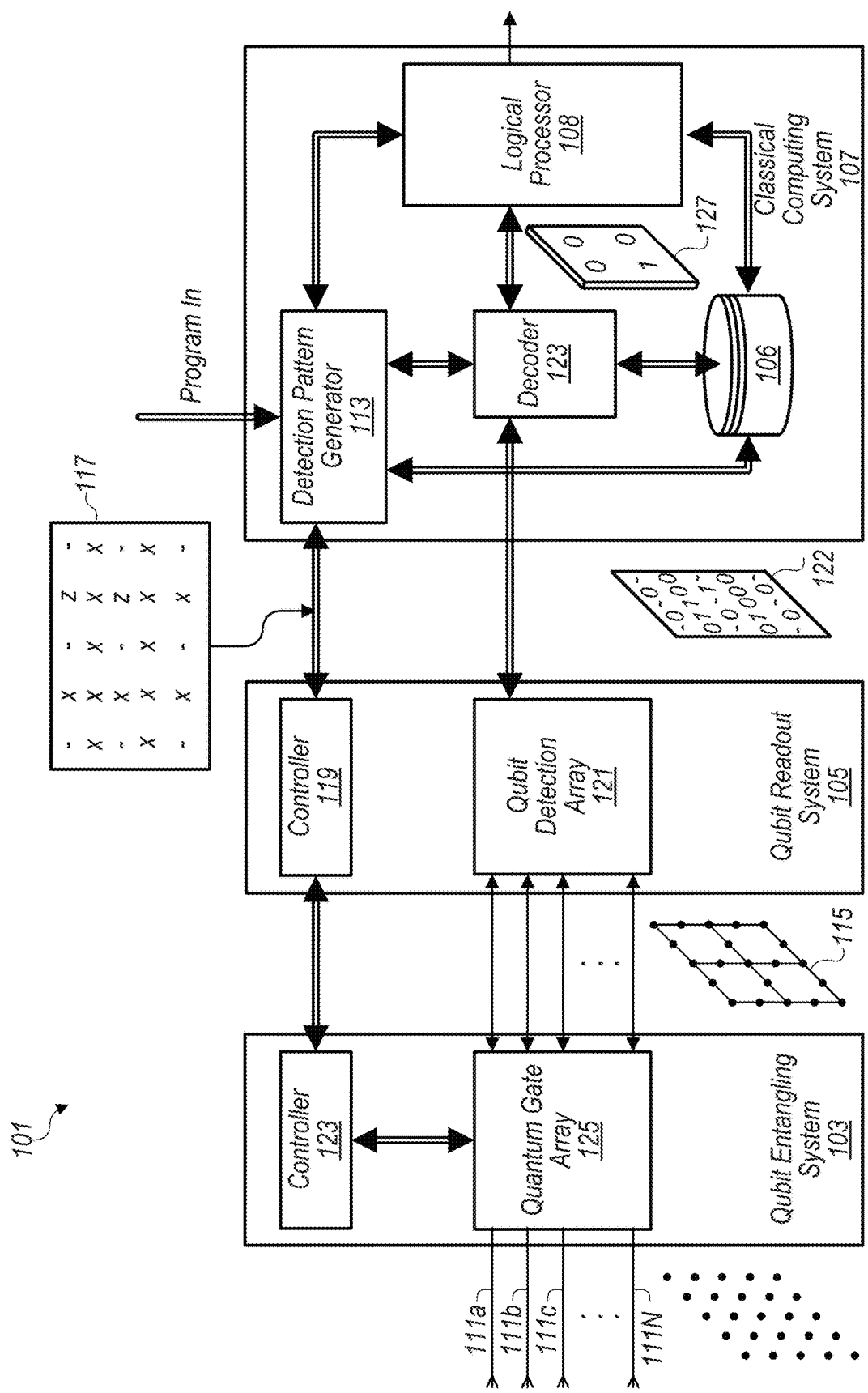
FIG. 1B shows a block diagram of a hybrid QC system 101 in accordance with some embodiments.

FIG. 1B shows a block diagram of a hybrid QC system 101 in accordance with some embodiments. Such a system can be associated with the hybrid computing system 101 introduced above in reference to FIG. 1A1. In FIG. 1B, solid lines represent quantum information channels and dashed represent classical information channels. The hybrid QC system 101 includes a qubit entangling system 103, qubit readout system 105, and classical computing system 107. In some embodiments, the qubit entangling system 103 takes as input a collection of N physical qubits, e.g., physical qubits 109 (also represented schematically as inputs 111a, 111b, 111c, ..., 111n) and generates quantum entanglement between two or more of them to generate an entangled state 115. For example, in the case of photonic qubits, the qubit entangling system 103 can be a linear optical system such as an integrated photonic circuit that includes waveguides, beam splitters, photon detectors, delay lines, and the like. In some examples, the entangled state 115 can be a lattice, cluster, or graph state, or one part of a larger lattice, cluster, or graph state that is created over the course of several clock cycles of the quantum computer. In some embodiments, the input qubits 109 can be a collection of quantum systems and/or particles and can be formed using any qubit architecture. For example, the quantum systems can be particles such as atoms, ions, nuclei, and/or photons. In other examples, the quantum systems can be other engineered quantum systems such as flux qubits, phase qubits, or charge qubits (e.g., formed from a superconducting Josephson junction), topological qubits (e.g., Majorana fermions), or spin qubits formed from vacancy centers (e.g., nitrogen vacancies in diamond). Furthermore, for the sake of clarity of description, the term "qubit" is used herein although the system can also employ quantum information carriers that encode information in a manner that is not necessarily associated with a binary bit. For example, qudits can be used, i.e., quantum systems that can encode information in more than two quantum states in accordance with some embodiments.

In accordance with some embodiments, the hybrid QC system 101 can be a quantum circuit-based quantum computer, a measurement-based quantum computer, or any other type of quantum computer. In some embodiments, a software program (e.g., a set of machine-readable instructions) that represents the quantum algorithm to be run on the hybrid QC system 101 can be passed to a classical computing system 107 (e.g., corresponding to system 108 in FIG. 1A above). The classical computing system 107 can be any type of computing device such as a PC, one or more blade servers, and the like, or even a high-performance computing system such as a supercomputer, server farm, and the like. Such a system can include one or more processors (not shown) coupled to one or more computer memories, e.g., memory 106. Such a computing system will be referred to herein as a "classical computer." In some examples, the software program can be received by a classical computing module, referred to herein as a detection pattern generator 113. One function of the detection pattern generator 113 is to generate a set of machine-level instructions from the input software program (which may originate as code that can be more easily written by a user to program the quantum computer), i.e., the detection pattern generator 113 can operate as a compiler, logic processor, and/or encoder to allow software programs to be run on the quantum computer. Detection pattern generator 113 can be implemented as pure hardware, pure software, or any combination of one or more hardware or software components or modules. In some examples, the compiled machine-level instructions take the form of one or more data frames that instruct the qubit readout circuit to make one or more quantum measurements on the entangled state 115. Measurement pattern 117 (e.g., a data frame) is one example of the set of measurements and/or gates that should be applied to the qubits of entangled state 115 during a certain clock cycle as the program is executed. In other examples, e.g., the measurement pattern 117 can include instructions for applying multi-qubit measurements and/or multi-qubit gates, e.g., in the case where a fusion gate is desired to be applied to two or more qubits or when stabilizer measurements are being performed. In some embodiments, several measurement patterns 117 can be stored in memory 106 as classical data. Generally, the measurement patterns 117 can dictate whether or not a detector from the qubit detection array 121 of the qubit readout circuit 105 should make a measurement on a given qubit that makes up the entangled state 115. In addition, the measurement pattern 117 can also store which basis (e.g., Pauli X, Y, Z, etc.) the measurement should be made in order to execute the program. In some examples, the measurement pattern 117 can also include a set of gates that should be applied by the qubit entangling circuit to the next set of physical qubits 109 that are to be processed at some future clock cycle of the hybrid QC system 101.

A controller circuit 119 of the qubit readout circuit 105 can receive data that encodes the measurement pattern 117 and generate the configuration signals necessary to drive a set of detectors within the qubit detection array 121. The detectors can be any detector that can detect the quantum states of one or more of the qubits in the entangled state 115. For example, for the case of photonic qubits, the detectors can be single photon detectors that are coupled to one or more waveguides, beam splitters, interferometers, switches, polarizers, polarization rotators and the like. One of ordinary skill will appreciate that many types of detectors may be used depending on the particular qubit architecture.

In some embodiments, the result of applying the detection pattern 117 to the qubit detection array is a readout operation that "reads out" the quantum states of the qubits in the entangled state 115. Once this measurement is accomplished, the quantum information stored within the entangled state 115 is converted to classical information that corresponds to a set of eigenvalues that are measured by the detectors, referred to herein as "measurement outcomes." These measurement outcomes can be stored in a measurement outcome data frame, e.g., data frame 122 and passed back to the classical computing system for further processing.

In some embodiments, any of the submodules in the hybrid QC system 101, e.g., controller 123, quantum gate array 125, detection array 121, controller 119, detection pattern generator 113, decoder 133, and logical processor 108 can include any number of classical computing components such as processors (CPUs, GPUs, TPUs) memory (any form of RAM, ROM), hard coded logic components (classical logic gates such as AND, OR, XOR, etc.) and/or programmable logic components such as field programmable gate arrays (FPGAs and the like). These modules can also include any number of application specific integrated circuits (ASICs), microcontrollers (MCUs), systems on a chip (SOCs), and other similar microelectronics.

As described herein, the logical qubit measurement outcomes 127 can be fault tolerantly recovered, e.g., via decoder 133, from the measurement outcomes 122 of the physical qubits. In the case of a cluster state that is also a stabilizer state, the error syndrome generated by the measurement of joint parity measurements (formed from the combination of one or more stabilizer measurements) are used by the decoder to identify and correct errors so that the correct logical qubit measurement outcome can be determined. Logical processor 108 can then process the logical outcomes as part of the running of the program. As shown, the logical processor 108 can feed back information to the detection pattern generator 113 to affect downstream gates and/or measurements to ensure that the computation proceeds fault tolerantly.

In accordance with some embodiments, it may be beneficial to synchronize, or otherwise coordinate in time, the actions of any or all of the components of the hybrid QC system. Advantageously, one or more embodiments provide systems and methods for clock signal generation and distribution using residual light (i.e., photons) from a train of pulses originating from the pump laser, e.g., housed within electronic and/or optical components 112 shown in FIG. 1A.

In the description that follows, embodiments are described that employ spatial modes of photons as the qubit system, but one of ordinary skill will appreciate that any type of qubit described by any type of mode can be employed without departing from the scope of the present disclosure. Furthermore, in what follows, photonic waveguides are used to define the spatial modes of the photon. However, one of ordinary skill having the benefit of this disclosure will appreciate that any type of mode, e.g., polarization modes, temporal modes, and the like, can be used without departing from the scope of the present disclosure. The diagrams shown in the remaining figures are schematic diagrams with each horizontal line representing a mode of a quantum system, e.g., a waveguide.

Figure 2:
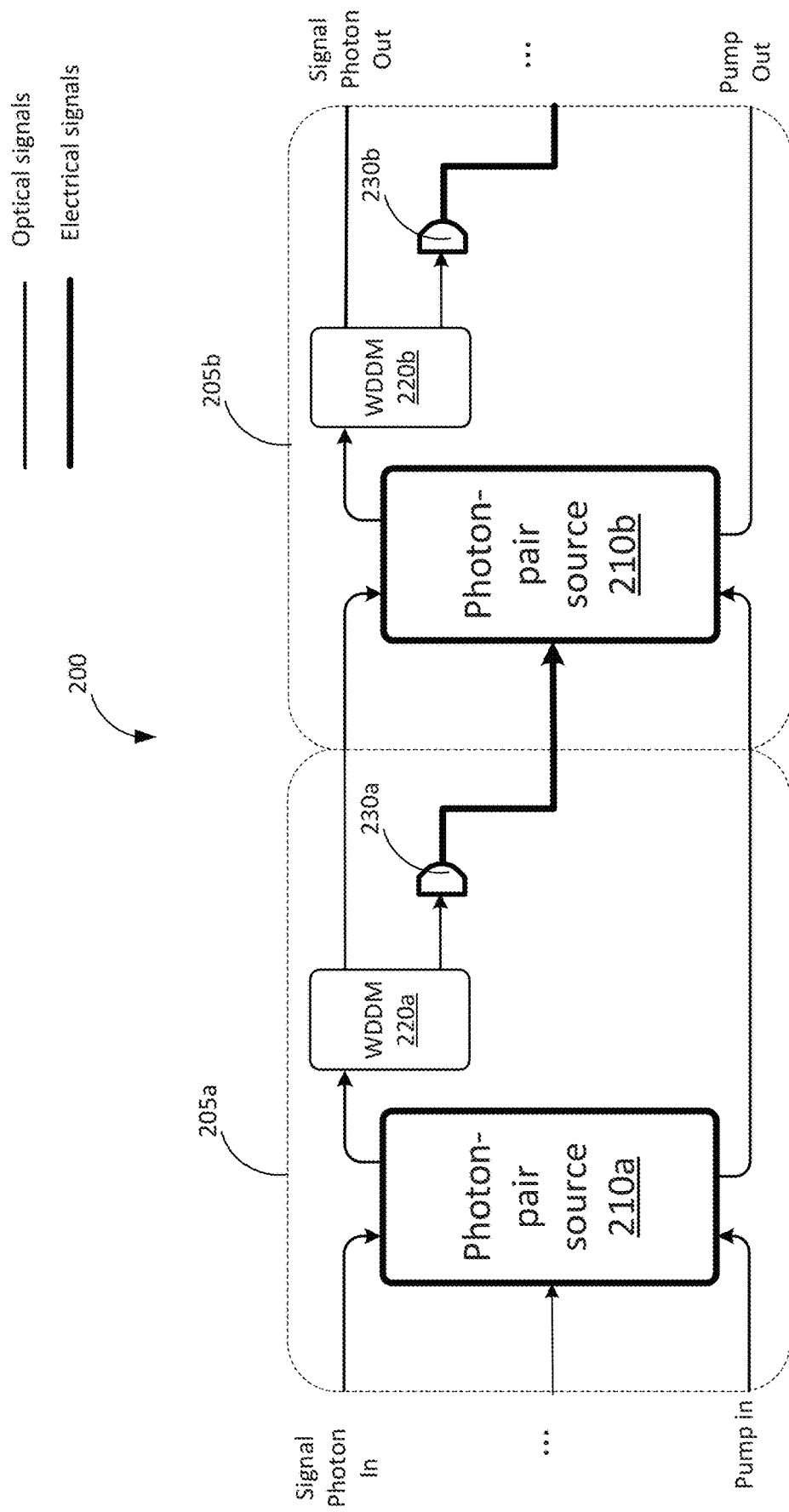
FIG. 2 is a simplified block diagram of an example of a single-photon source that may include a set of cascaded heralded photon sources (HPS's) according to some embodiments.

FIG. 2 is a simplified block diagram of an example of a single-photon source 200 that may include a set of cascaded HPS's according to some embodiments. In the example shown in FIG. 2, the single-photon source 200 may include multiple HPS's 205a, 205b, and the like, which may be collectively referred to as HPS's 205. Each HPS 205 may include a photon-pair source, such as the photon-pair source 210a in HPS 205a or the photon-pair source 210b in HPS 205b. Each photon-pair source 210a or 210b may generate a pair of photons based on, for example, spontaneous four wave mixing (SFWM) in third-order passive nonlinear optical materials or spontaneous parametric down-conversion (SPDC) in second-order passive nonlinear optical materials. In some implementations, a photon-pair source 210a or 210b may include a ring resonator that may support multiple resonances as described below.

It will be appreciated that although some embodiments are described in relation to a photon-pair source, this is not required and photon sources other than photon-pair sources are included within the scope of the present invention. Thus, for the sake of illustration, a microring-based SPFW heralded photon source (HPS) is described as an example of the source of photons. However, the precise type of photon source used is not critical and any type of nonlinear source, employing any process, such as SPFW, spontaneous parametric down-conversion (SPDC), or any other process can be used. Other classes of sources that do not necessarily require a nonlinear material can also be employed, such as those that employ atomic and/or artificial atomic systems can be used, e.g., quantum dot sources, color centers in crystals, and the like.

In some cases, sources may or may not be coupled to photonic cavities, e.g., as can be the case for artificial atomic systems such as quantum dots coupled to cavities. Other types of photon sources also exist for SPWM and SPDC, such as optomechanical systems and the like.

For the sake of illustration, an example which employs spatial multiplexing of several non-deterministic is described as an example of a multiplexed (MUX) photon source. However, many different spatial MUX architectures are possible without departing from the scope of the present disclosure. Temporal MUXing can also be implemented instead of or in combination with spatial multiplexing. MUX schemes that employ log-tree, generalized Mach-Zehnder interferometers, multimode interferometers, chained sources, chained sources with dump-the-pump schemes, asymmetric multi-crystal single photon sources, or any other type of MUX architecture can be used. In some embodiments, the photon source can employ a MUX scheme with quantum feedback control and the like.

In each photon-pair source 210a or 210b, photons may be non-deterministically produced in pairs, where each pair includes a signal photon and an idler photon, the existence of one photon (e.g., the idler photon) may indicate the existence of the other photon (e.g., the signal photon) in the pair. The two photons in each pair may be separated to two output channels by a splitter, for example a wavelength division demultiplexing (WDDM) device 220a or 220b, based on their different frequencies. One photon (e.g., the idler photon) on one output channel of the splitter (e.g., WDDM device 220a or 220b) may be detected by a single photon detector (SPD) 230a or 230b. If a photon is detected by an SPD 230a or 230b, a corresponding photon (e.g., the signal photon) that is generated in the same pair as the detected photon would exist on a different output channel of the splitter 220a or 220b, and thus can be used as the output of the single-photon source 200. When an idler photon is detected by an SPD 230a or 230b in one of the cascaded HPS's 2050a and 205b, the SPD 230a or 230b may send an electrical signal (referred herein as a heralding signal) to the other HPS's, so that those HPS's may be switched off or bypassed. For instance, in the example shown in FIG. 2, if a photon is detected by the SPD 230a in the first HPS 205a, the SPD 230a may send a heralding signal to the second HPS 205b, so that the second HPS 205b may be turned off or bypassed. The signal photon generated by the first HPS 205a may pass through the second HPS 205b as an output of single-photon source 200.

Figure 3:
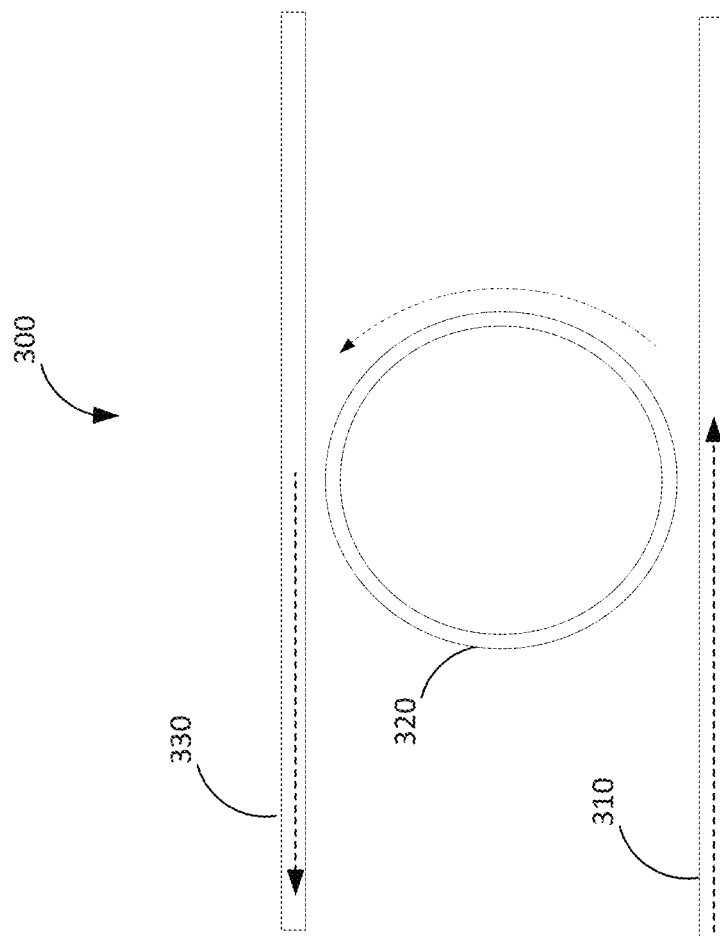
FIG. 3 illustrates an example of a photon-pair source according to some embodiments.

FIG. 3 illustrates an example of a photon-pair source 300 according to some embodiments. The photon-pair source 300 may include a first waveguide 310, a second waveguide 330, and a ring resonator 320 positioned between the first waveguide 310 and the second waveguide 330. Pump light (e.g., generated by a laser source) may be propagated in the first waveguide 310 (as indicated by the arrow), and may be coupled into the ring resonator 320. The ring resonator 320 may include a waveguide loop such that a resonance for light having a certain wavelength may occur when the optical path length of the ring resonator 320 is an integer number of the wavelength of the light. The ring resonator 320 may support multiple resonances at multiple wavelengths that may meet the resonance condition. The spacing between these resonances may be referred to as the free spectral range (FSR) and may depend on the optical path length of the ring resonator 320.

The ring resonator 320 may include a nonlinear optical material, such as a second-order or third-order passive nonlinear optical medium. Spontaneous four wave mixing (SFWM) or spontaneous parametric down-conversion (SPDC) process may occur in the ring resonator 320. In an SFWM process, two pump photons may be converted into a pair of daughter photons (e.g., a signal photon and an idler photon) in the nonlinear optical material. Due to energy conservation, the signal photon and the idler photon may be at frequencies that are symmetrically distributed around the pump frequency (e.g., one at frequency $f_0+\Delta f$, the other one at frequency $f_0-\Delta f$, where $f_0$ is the frequency of pump photons).

The signal photon and the idler photon generated within the ring resonator 320 may be coupled out of the ring resonator 320 into the second waveguide 330 at a certain coupling efficiency. The propagation directions of the photons in the first waveguide 310, the ring resonator 320, and the second waveguide 330 may be as shown by the arrows in FIG. 3. In addition to photon pairs that are generated by the resonator 320, certain amount of unconverted pump photons may also be coupled from the ring resonator 320 into the second waveguide 330.

The photon-pair source 300 may generate photon pairs in a non-deterministic manner. That is, the photon pairs are not generated on-demand, but instead are generated probabilistically. The success rate may be only 1-5%. For example, a photon pair may be successfully generated only once in every 20 pump pulses. As a result, a heralded photon source (HPS) that uses a photon-pair source 300 to generate single photons (e.g., the HPS 205a or 205b illustrated in FIG. 2) may also generate single photons in a non-deterministic manner. According to some embodiments, multiple HPS's may be cascaded (e.g., as illustrated in FIG. 2), or multiplexed to form a quasi-deterministic single-photon source, as described below.

Figure 4:
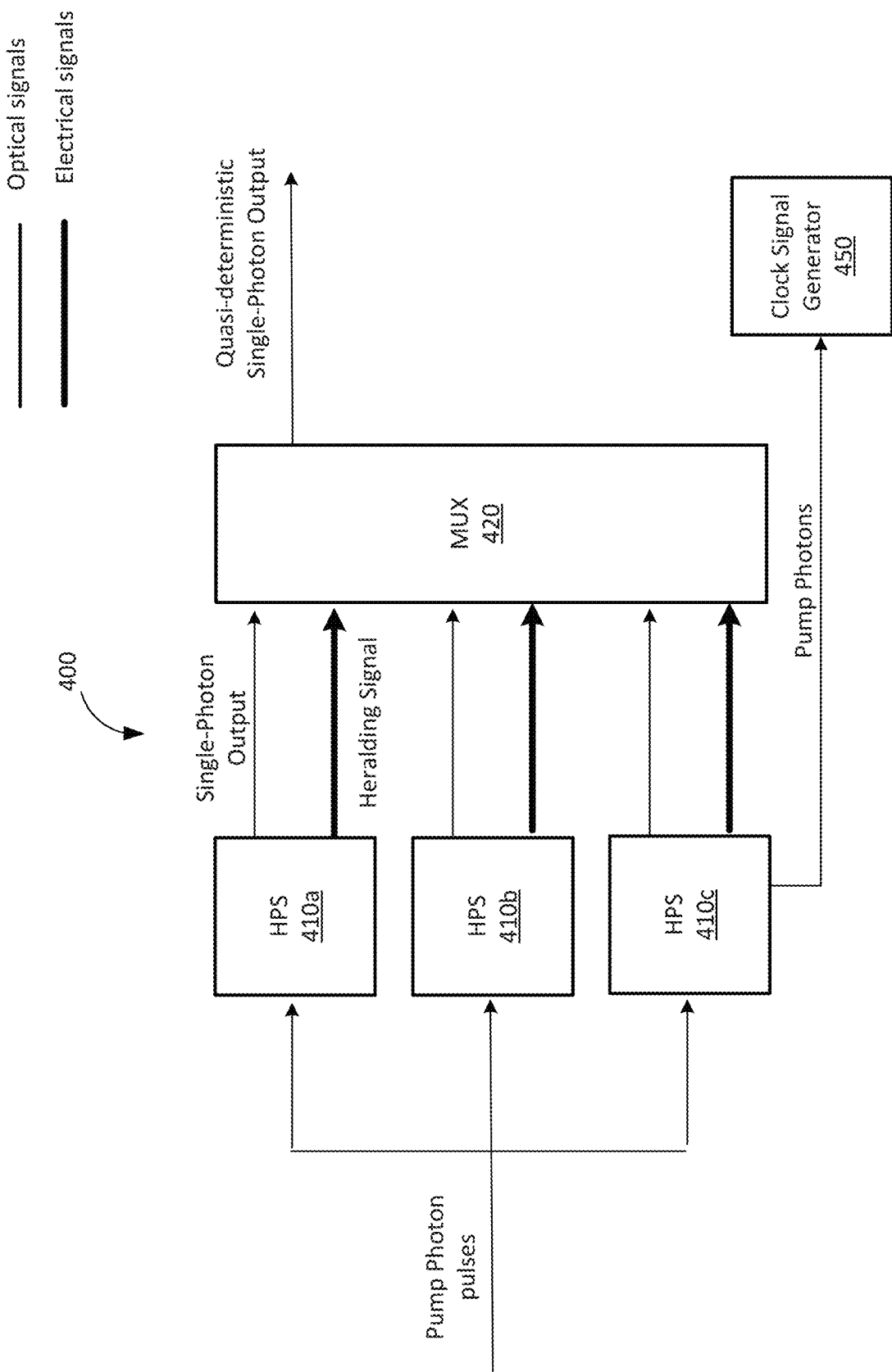
FIG. 4 illustrates an example of a single-photon source that includes several HPS's that are multiplexed according to some embodiments.

FIG. 4 shows, as an example, a single-photon source 400 that includes three HPS's 410a-410c that are multiplexed. Pump photon pulses (e.g., laser pulses) are distributed to each HPS 410a, 410b, and 410c, for example, simultaneously. The outputs of the HPS's 410a-410c are coupled to a multiplexer (MUX) 420. FIG. 4 shows a single-photon source 400 that includes three HPS's for illustration purposes, a single-photon source may include twenty or more HPS's in some embodiments.

Figure 5B:
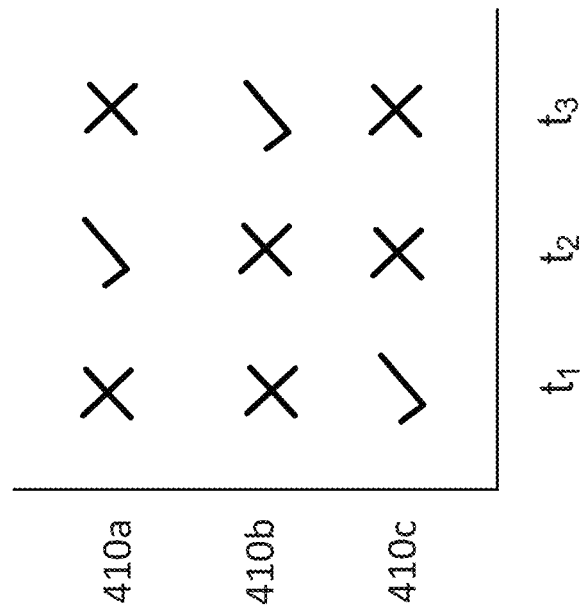
FIG. 5B illustrates the non-deterministic manner in which the HPS's illustrated in FIG. 4 generate single photons.
Figure 5A:
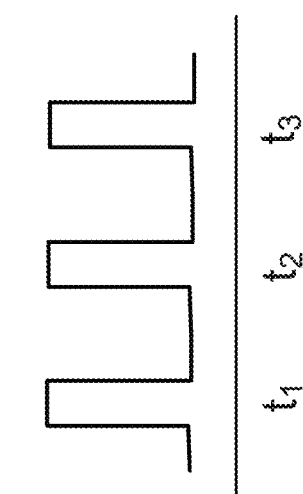
FIG. 5A illustrates schematically a train of pump photon pulses that arrive at the HPS's shown in FIG. 4 according to some embodiments.

Each of the HPS's 410a-410c may generate single photons in a non-deterministic manner. For example, FIG. 5A illustrates schematically a train of pump photon pulses that arrive at the HPS's 410a, 410b, and 410c at time slots $t_1$, $t_2$, and $t_3$. As illustrated in FIG. 5B, the first HPS 410a may not generate any single photon at the first time slot $t_1$ and the third time slot $t_3$ (indicated by the crosses), but may generate a single photon at the second time slot $t_2$ (indicated by the check symbol). Similarly, the second HPS 410b may not generate any single photon at the first time slot $t_1$ and the second time slot $t_2$, but may generate a single photon at the third time slot $t_3$; and the third HPS 410c may not generate any single photon at the second time slot $t_2$ and the third time slot $t_3$, but may generate a single photon at the first time slot $t_1$.

When an idler photon is detected (e.g., by a single-photon detector) in a HPS 410a, 410b, or 410c, the HPS 410a, 410b, or 410c may send a heralding signal to the multiplexer 420. The multiplexer 420 may be configured to select the single-photon output of one of the HPS's 410a, 410b, and 410c as its single photon output, and ignore the single-photon outputs of all other HPS's. When there are sufficient number of HPS's, the single-photon source 400 may be able to produce a single photon for each pump photon pulse in a quasi-deterministic manner. For instance, in the example illustrated in FIGS. 4 and 5A-5B, the multiplexer 420 may select the single-photon output of the third HPS 410c at the first time slot $t_1$, the output of the first HPS 410a at the second time slot $t_2$, and the output of the second HPS 410b at the third time slot $t_3$, so that the single-photon source 400 outputs a single phone for each of the pump photon pulses at time slots $t_1$, $t_2$, and $t_3$.

In order for the system to deterministically sequence the multiple operations of the various components, including, e.g., one or more single-photon sources like 400a, 400b, 400c, one or more MUXes like MUX 420, and/or any other downstream components, such as any or all of those components shown in FIGS. 1A-1B, a shared, or master, clock signal may be beneficial. Accordingly, in some embodiments, the clock signal generator 450 can convert a portion of the pump photon pulses to a clock signal that then can be distributed to the various components to conduct the desired coordination between components. While the portion of the pump signal used to derive the clock signal shown in FIG. 4 is derived from an output of a single photon source, the portion can be provided from any number different upstream or combination of blocks without departing from the scope of the present disclosure.

Referring again to FIG. 1B, the physical qubit inputs 111a, 111b, 111c, . . . , 111n can be single photons generated by upstream single-photon sources (not shown) and may be coupled into the qubit entangling system 103, which in this example may be, e.g., a complex linear optical circuit (e.g., there may be up to a million qubits). For example, the linear optical quantum circuit may include optical components such as switches, beamsplitters, phase shifters, photon detectors that need to be coordinated in order to entangle two or more single photons or two or more entangled cluster states of photons. The linear optical quantum circuit may include quantum gates (e.g., fusion gates) at various locations to perform the quantum computing. The Qubit Readout System 105 can include many single-photon measurement circuits and also may include many photon fusion circuits (e.g., type I and/or type II fusion gates) which can measure the photons to obtain results of the quantum computing. In some architectures, the quantum gates themselves can be formed/defined by a sequence of measurement and/or fusion operations that are to be performed on the individual photons. In either case, there are a number of operations within the quantum computer that may need to be precisely timed. Thus, a precise system clock may be needed to serve as a "master conductor" to control the timing of various operations of the quantum computer 101.

In some embodiments, the system clock may be set by the photon generation rate of the single-photon sources. The single-photon sources may be driven by a high-power pump laser that produces a train of pump photon pulses at certain repetition rate (e.g. square wave pulses at 100 ps spacing, corresponding to a repetition rate of about 10 GHz). The high-power pump laser may in turn be driven by an electrical signal having a similar repetition rate. Thus, one option for generating a clock signal is to tap off some of the electrical signals that generate the pump photon pulses and pipe it to the linear optical quantum computer 101 to be used as a master clock. Unfortunately, this option may not work for one or more of the reasons discussed below.

As discussed above, many components of the linear optical quantum computer 101 may be implemented on a chip, which is placed inside a cryostat so as to keep those components at a cryogenic temperature for achieving high performances. On the other hand, the electrical circuitry that drives the pump photon source (e.g., a power laser source) may be remotely located from the chip and may be at room temperature. As such, there may be electrical and optical interconnects between the pump photon source and the linear optical quantum computer 101 that are subject to very different temperature environments (e.g., from room temperature of about 293 K to about 4 K inside the cryostat). As a result, a master clock generated in this way may have random phase errors. Because of the tight timing tolerances required by a linear optical quantum computer, the phase errors may render such as master clock unsuitable for use for the linear optical quantum computer.

Another approach to generate a clock signal is to generate clock signals from the heralding signals when idler photons are detected in a heralded photon source (HPS). This approach, however, may not work either. As discussed above, a HPS may generate single-photons in a non-deterministic manner. The success rate may be only 1-5% (e.g., only one single photon is generated for every 20 pump photon pulses). Thus, the heralding signal rate may be a lot slower than the pump pulse rate. The slow rate and the non-deterministic nature of the heralding signals make them unsuitable for recovering clock signals therefrom.

Embodiments of the present invention provide methods of generating clock signals for a photonic quantum computer that utilize the excess pump photons rejected by the single-photon sources that generate the single-photon qubits for the photonic quantum computer. The excess pump photons would ordinarily be wasted and dumped out of the system. By generating clock signals locally on the chip where the photonic quantum computer resides, which is usually placed inside a cryostat, random phase errors may be prevented or reduced.

Figure 6:
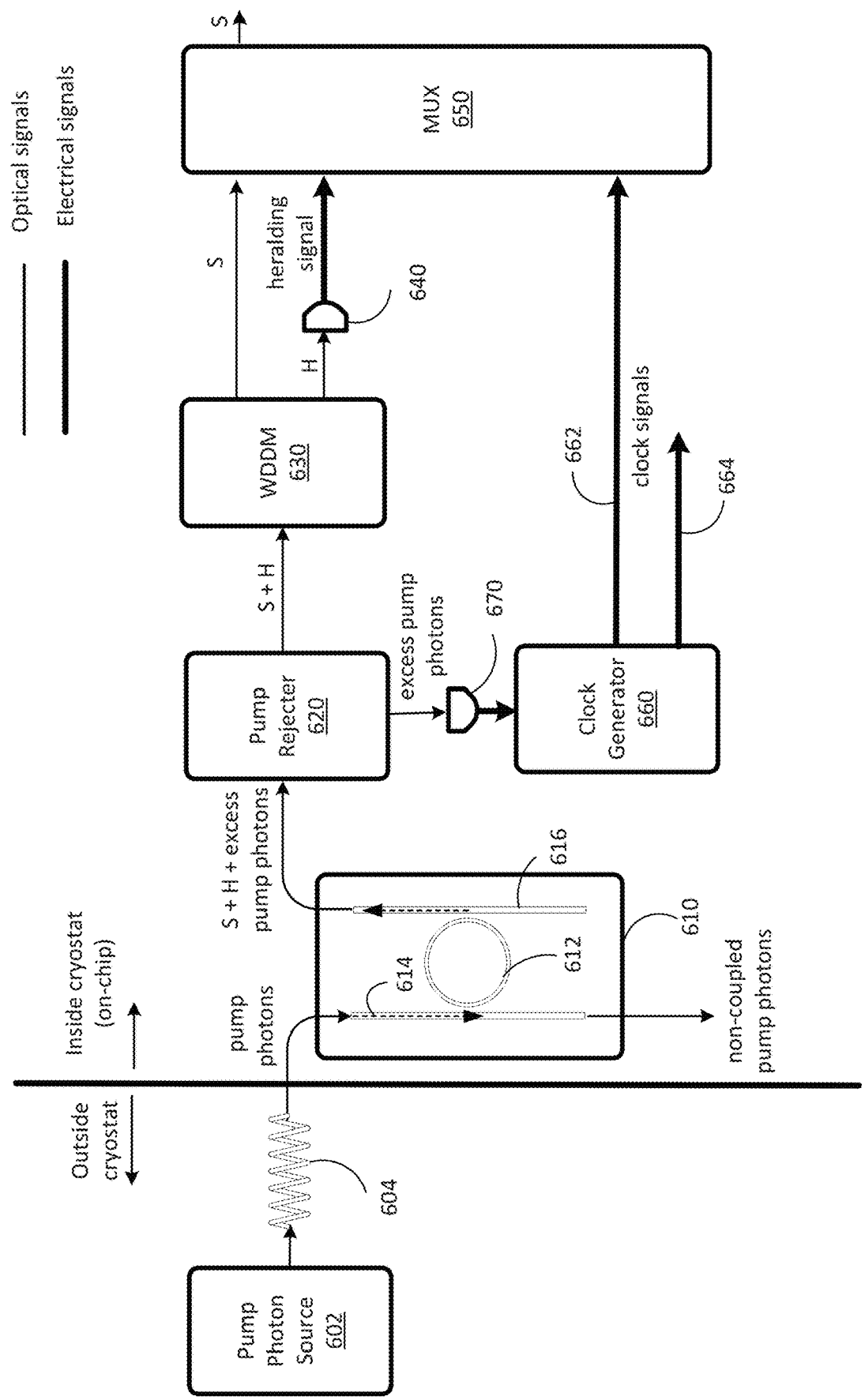
FIG. 6 illustrates a schematic block diagram of a system for generating clock signals for a photonic quantum computer according to some embodiments.

FIG. 6 illustrates a schematic block diagram of a system for generating clock signals for a photonic quantum computer according to some embodiments. The system may include a pump photon source 602 and a photon-pair source 610. The pump photon source 602 may be configured to generate a train of pump photon pulses to be coupled into the photon-pair source 610 via a waveguide 604, such as an optical fiber. The train of pump photon pulses may have a repetition rate of, for example, 10 GHz and the like.

The photon-pair source 610 may reside on a chip that is placed inside a cryostat (e.g., at a cryogenic temperature). The pump photon source 602 may reside remotely from the chip at room temperature. The waveguide 604 may be configured to have certain length so as to cause a desired time delay for the train of light pulses.

The photon-pair source 610 may be similar to the photon-pair source 300 illustrated in FIG. 3 according to some embodiments. For example, the photon-pair source 610 may include a first waveguide 614, a second waveguide 616, and a resonator 612 (e.g., one or more ring resonators). The pump photons are coupled into the first waveguide 614, some of which are coupled into the resonator 612. The resonator 612 may include a nonlinear optical material that may convert two pump photons into a pair of photons, one being a signal photon (S), the other being an idler photon or heralding photon (H). A majority of the pump photons that are coupled into the ring resonator 612 may be unconverted, which are referred herein as excess pump photons. The converted pairs of signal photon and heralding photon, as well as the excess pump photons, may be coupled into the second waveguide 616 and be output from the photon-pair source 610. In addition, a portion of the pump photons that are coupled into the first waveguide 614 may not be coupled into the ring resonator 612. These pump photons are referred herein as non-coupled pump photons. The non-coupled pump photons may be absorbed by a beam dump (not shown).

As discussed below in relation to FIG. 7, in addition to the clock generation architecture illustrated in FIG. 6, alternative embodiments utilize all or a portion of the non-coupled pump photons during the clock generation process. Moreover, combinations in which coupled pump photons in addition to or in place of non-coupled pump photons are utilized are included within the scope of the present invention. One of ordinary skill in the art would recognize many variations, modifications, and alternatives.

The system may further include a pump rejecter 620 coupled to the output of the photon-pair source 610. The pump rejecter 620 may be configured to separate the excess pump photons from the converted pairs of signal photon and idler photon. Since the signal photon and idler photon may have different frequencies from that of the excess pump photons, the pump rejecter 620 may include a spectral filter configured to separate the excess pump photons from the signal photons and the idler photons spectrally. For example, assuming that the frequency of the pump photons is $f_0$, the signal photon and the idler photon may have frequencies $f_0+\Delta f$ and $f_0-\Delta f$, respectively. The pump rejecter 620 may include a notch filter that passes the signal photon and the idler photon at their respective frequencies and send the pump photons at frequency $f_0$ along a different path. As discussed above, a majority of the pump photons in a pump photon pulse (e.g., in the order of $10^{10}$ photons per 10 pJ pulse) may be unconverted.

Similar to the heralded photon source (HPS) 205a illustrated in FIG. 2, the signal photon (S) and the idler photon (H) may be passed onto a wavelength division demultiplexing (WDDM) device 630, which separates the signal photon and the idler photon spectrally. The idler photon (H) may be detected by a single-photon detector (SPD) 640. The single-photon detector 640 may send a heralding signal (electrical signal) to a multiplexer 650 when it detects an idler photon, so that the multiplexer 650 may couple the signal photon (S) to its output to be used a qubit for the photonic quantum computer, and bypass or ignore the outputs of other HPS's coupled to the multiplexer 650 (not shown in FIG. 6).

The system may further include a photodetector 670 and a clock generator 660. The photodetector 670 is optically coupled to the pump rejecter 620 for receiving the excess pump photons rejected by the pump rejecter 620. The photodetector 670 may convert the excess pump photons into electrical pulses. The electrical pulses are in turn input into the clock generator 660, which generates clock signals from the electrical pulses. In some embodiments, the clock generator 660 may include an optoelectronic amplifier that amplifies the electrical pulses generated by the photodetector 670 to generate the clock signals 662 and 664.

In some embodiments, photodetector 670 may be integrated with clock generator 660. Thus, embodiments in which photodetector 670 is integrated with clock generator 660 as well as embodiments in which photodetector 670 is implemented separately, e.g., as a separate element, from clock generator 660 are included within the scope of the invention. One of ordinary skill in the art would recognize many variations, modifications, and alternatives.

Figure 12A:
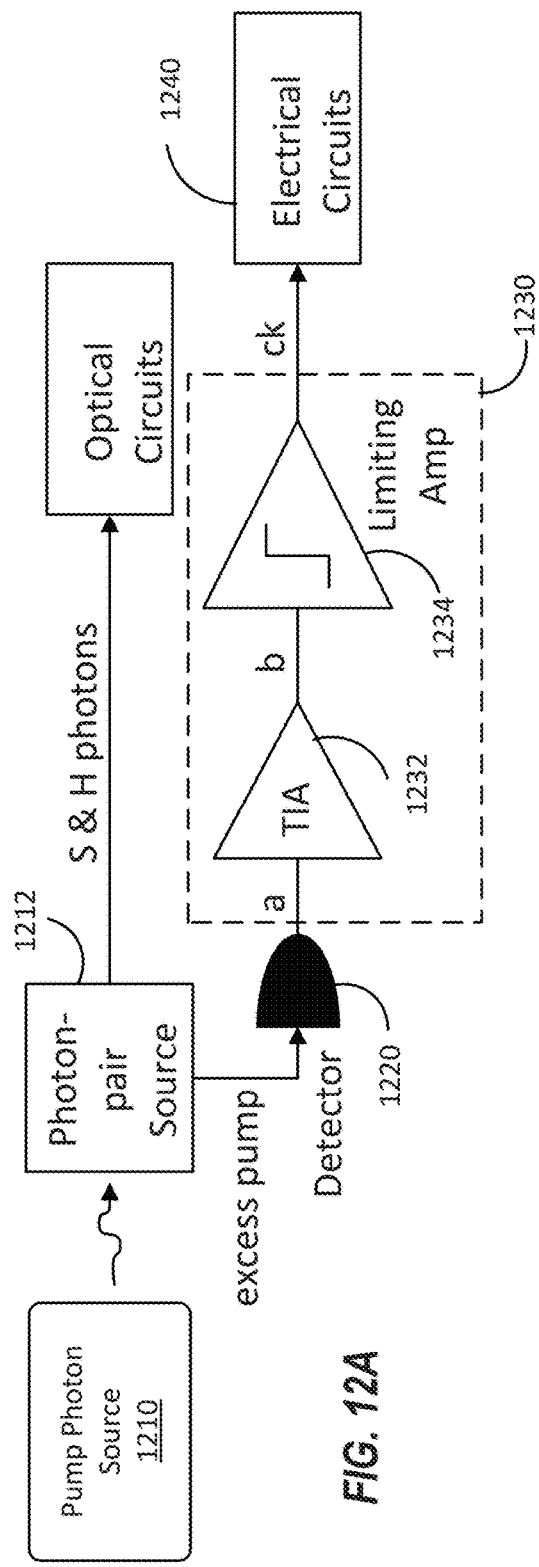
FIG. 12A is a simplified schematic diagram illustrating a system including a clock signal generator according to an embodiment of the present invention.
Figure 12B:
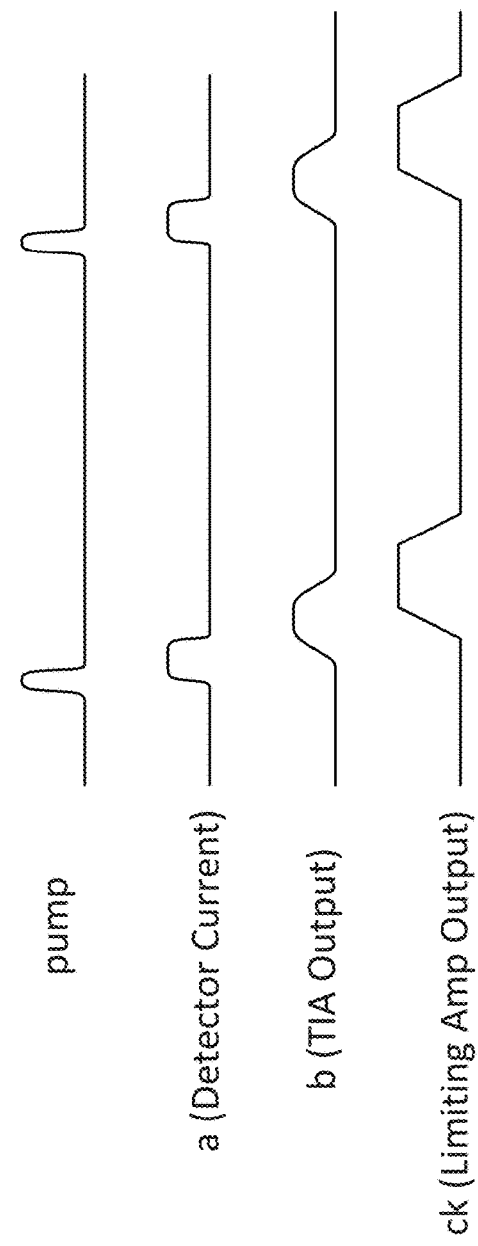
FIG. 12B is a set of plots illustrating optical and electrical signals associated with various elements of the system illustrated in FIG. 12A.

FIG. 12A is a simplified schematic diagram illustrating a system including a clock signal generator according to an embodiment of the present invention. FIG. 12B is a set of plots illustrating optical and electrical signals associated with various elements of the system illustrated in FIG. 12A. The clock signal generator 1230 illustrated in FIG. 12A can be utilized as any of the clock signal generators described in this application, for example, clock generator 660, clock generator 760, clock generator 860, or clock generator 960. As illustrated in FIG. 12A, the system includes a pump photon source 1210 and a photon-pair source 1212, which can be compared to pump photon source 602 and photon-pair source 610 in FIG. 6, respectively. Referring to FIG. 12B, the optical signal, e.g., optical pulses, delivered by pump photon source 1210 is illustrated as the plot for the pump in FIG. 12B.

Excess pump photons are delivered to detector 1220, which can be compared to photodetector 670 in FIG. 6. Detector 1220 converts the excess pump photons into electrical pulses. Referring to FIG. 12B, the electrical pulses output by detector 1220 are illustrated as plot "a", i.e., Detector Current. Clock signal generator 1230 receives the electrical pulse output by detector 1220 and includes a transimpedance amplifier (TIA) 1232 and a limiting amplifier 1234. The output of the TIA 1232 is illustrated as plot "b" in FIG. 12B, i.e., TIA Output. The limiting amplifier 1234 thus outputs the clock signal "ck" illustrated in FIG. 12B, i.e., Limiting Amp Output. The clock signal "ck" can be considered as the recovered electrical clock from the pump photon source and provided to electrical circuits 1240 as described herein.

Figure 11:
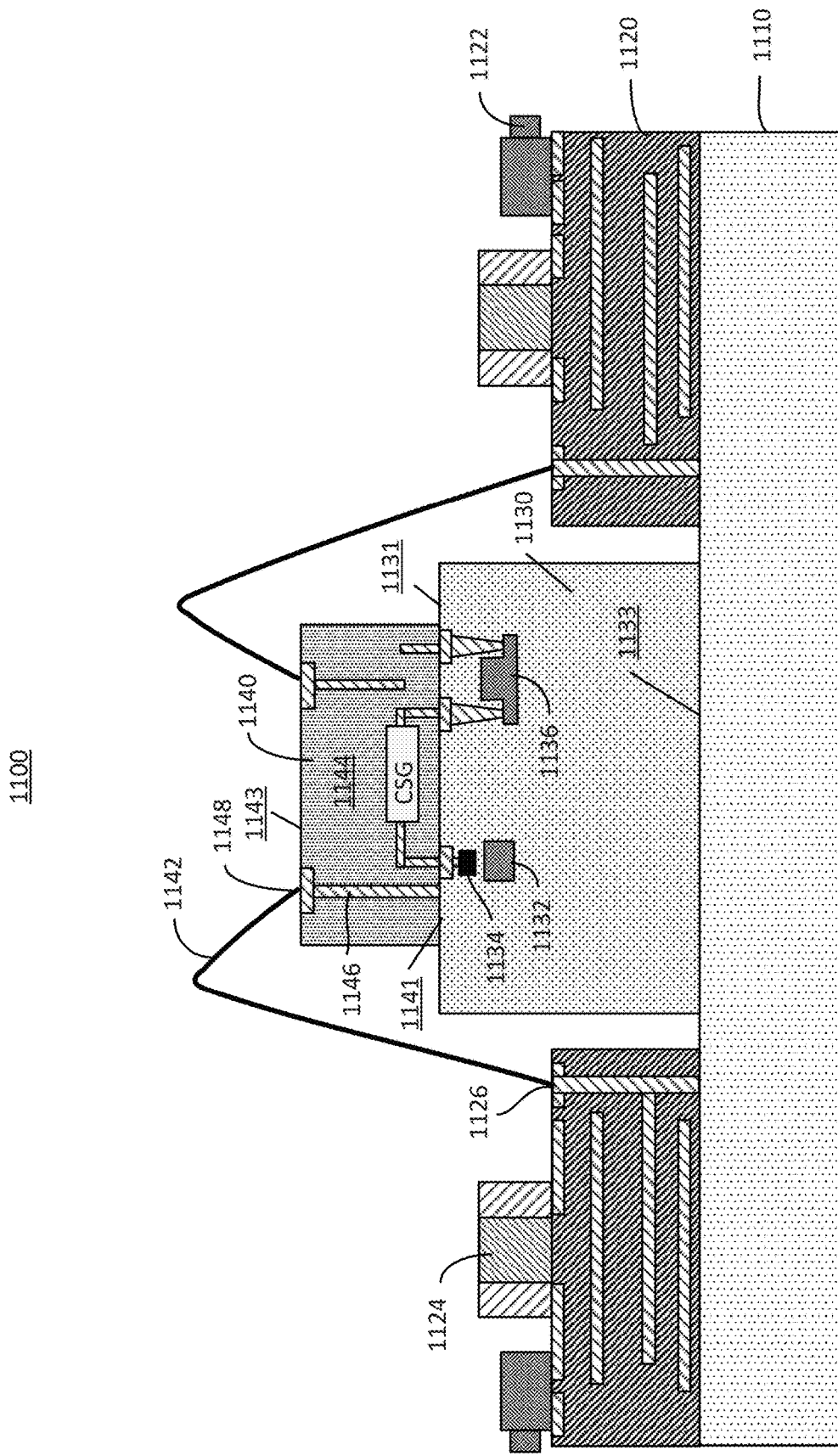
FIG. 11 is a cross-sectional view of a package that includes a photonic integrated circuit and an electronic integrated circuit according to certain embodiments.

FIG. 11 is a cross-sectional view of a package that includes a photonic integrated circuit and an electronic integrated circuit according to certain embodiments. Referring to FIG. 11, package 1100 includes a photonic integrated circuit (PIC) die 1130, also referred to as a PIC wafer, an electronic integrated circuit (EIC) die 1140, a PCB 1120, one or more electrical connectors 1122, and optical fibers 1150 on a silicon handle wafer 1110. Even though FIG. 11 only shows one PIC/EIC die stack, multiple PIC/EIC die stacks may be included in package 1100. As illustrated, a PCB 1120 is attached to silicon handle wafer 1110, e.g., using an epoxy or through fusion bonding or hybrid bonding, depending on the material of PCB 1120. One or more PCBs 1120 may be attached to silicon handle wafer 1110 at different horizontal or vertical locations. A PIC/EIC die stack includes EIC die 1140 bonded face-to-face with PIC die 1130 (e.g., by fusion bonding or hybrid bonding) such that the PICs may directly face the EICs. The PIC/EIC die stack may be bonded to silicon handle wafer 1110 by, for example, fusion bonding. EIC die 1140 may be electrically connected to PCB 1120 through bonding wires 1142, where the bonding pads and bonding wires may only be at the top and bottom sides of the PIC/EIC die stack. The left and right sides of the PIC/EIC die stack may be coupled with optical fibers, which may be attached to PCB 1120 through harnesses. PCB 1120 may also include electrical connectors 1122 and some other electronic components, such as voltage regulators, power management ICs, decoupling capacitors, etc.

In the cross-sectional view illustrated in FIG. 11, PCB 1120 and the PIC/EIC die stack are bonded to a top surface of silicon handle wafer 1110. PCB 1120 may include multiple layers of interconnect traces or planes connected through vias. Electronic components, such as electrical connector 1122 and decoupling capacitors 1124 may be soldered on the top surface of PCB 1120. PCB 1120 may also include solder pads 1126 on the top surface of PCB 1120.

The PIC/EIC die stack may include PIC die 1130 and EIC die 1140. PIC die 1130 may include a back surface 1133 bonded to silicon handle wafer 1110. PIC die 1130 may also include a front surface 1131 that may include circuits or pads. EIC die 1140 may include a back surface 1143 that may include a redistribution layers (RDL) and bonding pads 1148. EIC die 1140 may also include a front surface 1141 that may include circuits or pads. EIC die 1140 and PIC die 1130 may be bonded face-to-face with each other such that front surface 1131 of PIC die 1130 and front surface 1141 of EIC die 1140 may directly face each other and the interconnections can be short. PIC die 1130 may include waveguides 1132 and 1136, and photodetectors 1134. EIC die 1140 may include some through-silicon vias (TSVs) 1146 and control logic circuits 1144. A photodetector 1134 may detect a single photon from waveguide 1132, and send the detection result to control logic circuit 1144, which may determine whether and how to tune waveguide 1136 (e.g., to turn on or off an optical switch). Bonding pads 1148 may be connected to control logic circuits 1144 through TSVs, and may also be connected to solder pads 1126 on PCB 620 through bonding wires 1142.

Utilizing a package as illustrated in FIG. 11, some embodiments implement the clock signal generator in the PIC, whereas other embodiments implement the clock signal generator utilizing elements present in both the PIC and the EIC. Thus, signal paths passing from the PIC to the EIC and from the EIC to the PIC can be utilized to provide both electrical and optical or photonic functionality. Thus, FIG. 11 illustrates an architecture that enables photodetector 670 to be integrated with clock generator 660 in the PIC. This architecture also enables clock generator 660 to be implemented with some elements in the EIC as well as separate elements, for example, photodetector 670, implemented in the PIC. Thus, embodiments of the present invention implement the clock signal generator in a single semiconductor package that can be disposed in a cryostat for low temperature operation. One of ordinary skill in the art would recognize many variations, modifications, and alternatives.

Referring to FIG. 11, in one embodiment, photodetector 1134 implemented in PIC die 1130 serves as photodetector 660 in FIG. 6 and the clock signal generator (CSG) implemented in EIC die 1140 serves as clock generator 660. Thus, although FIG. 11 illustrates a number of components that may not be utilized to implement elements of the clock generator, FIG. 11 illustrates an exemplary implementation. Additional description related to integration of PIC dies and EIC dies in a single package is provided in U.S. Provisional Patent Application No. 62/784,284, filed on Dec. 21, 2018, the disclosure of which is hereby incorporated by reference in its entirety for all purposes.

It will be appreciated that the EIC and the PIC can be implemented on a single substrate or different substrates as appropriate to the particular application. Moreover, the EIC and PIC, if implemented on different substrates, can be implemented in a single package. Thus, embodiments of the present invention utilize integration of elements, for example, onto the same substrate or the same package, that results in improvements and system performance not available using free-space techniques. One of ordinary skill in the art would recognize many variations, modifications, and alternatives.

The clock signals may be input to the multiplexer 650, as illustrated by clock signal 662, for controlling the operations of the multiplexer 650 (e.g., controlling the timing of multiplexing). The clock signals may also be used, as illustrated by clock signal 664, to control the operations of the other components of a photonic quantum computer, such as the classical computer 140, the linear optical quantum circuit 120, and the reconfigurable single-photon measurement circuit 130 (as illustrated in FIG. 1A).

Because the clock signals are generated off of the excess pump photons, the clock signals may have the same repetition rate as that of the pump photon pulses (e.g., 10 GHz). As discussed above, the photon-pair source 610 may generate photon pairs non-deterministically, and the probability of successfully generating a photon pair may be only 1-5%

(e.g., only one photon pair is generated for every 20 pump photon pulses). Thus, if the clock signals are generated off the heralding signals generated by the single photon detector 640, the clock signals would have been a lot slower. The method of generating clock signals as described above can prevent such a problem.

Referring to FIG. 6, one photon-pair source 610 is utilized in conjunction with one clock generator 660, however, embodiments of the present invention are not limited to this particular implementation.

FIG. 13 is a simplified schematic diagram illustrating generation of a clock signal in conjunction with two or more photon-pair sources. In the example shown in FIG. 13, multiplexed sources are used but these sources can be individual non-multiplexed non-deterministic sources or any combination of non-multiplexed and multiplexed sources. In this example, pump photon pulses (not shown) can be provided to any of the multiplexed sources, e.g., multiplexed sources 1303$a$, . . . 1303$n$, a portion of which are utilized to generate a corresponding clock signal 1307$a$, . . . , 1307$b$, at each source, e.g., as described above in reference to FIGS. 6-9. The clock signals are provided to a clock mediator 1305 which can generate a single master clock 1309 based on the individual clock signals. There are many ways to generate such a master clock. For example, the clock mediator can perform one or more diagnostic measurements on the individual clock signals and choose one based on some criteria, such as Allan deviation, frequency jitter, phase relative to photon generation time, and the like. In other embodiments, 1305 can take the input clock signals and combine them via one or more mixers or other frequency reference generation circuits. In some embodiments the clock mediator 1305 itself can include one or more frequency references that can be used for the generation of the master clock.

FIG. 6 illustrates a single photon-pair source, however, it will be appreciated that systems can include multiple photon-pair sources. Thus, although FIG. 6 illustrates a clock signal for each photon-pair source, this is not required by the present invention and typically, one clock signal will be generated in conjunction with multiple photon-pair sources. It should be noted that even if no photon-pair is produced by photon-pair source 610, a clock signal can still be generated. Thus, a clock generator can be associated with every photon-pair source, with selection of clock signals performed, or only associated with one of many photon-pair sources.

According to some embodiments, the photon-pair source 610, the pump rejecter 620, the WDDM device 630, the single-photon detector 640, the multiplexer 650, the photodetector 670, and the clock generator 660 may reside on a single chip that is placed inside a cryostat. The photodetector 670 may include a photodiode that is cryogenic-compatible (e.g., a Ge photodiode). Additional photon-pair sources (not shown in FIG. 6) may be multiplexed by the multiplexer 650 to form a pseudo deterministic single-photon source (e.g., as illustrated in FIG. 4). Because the clock signals are generated off of the excess pump photons from the photon-pair source 610 that resides on the chip inside the cryostat, the clock signals may be in synch with the phases of the single photons generated by such a single-photon source.

In comparison, if the clock signals are generated directly from the electrical signals that drive the pump photon source 602, which resides outside the cryostat at room temperature, the clock signals may have random phase errors and drifts caused by the uncertain delays in the electrical path due to the vast difference in temperatures. Such phase errors and drifts may render the clock signals unsuitable for the proper operation of the photonic quantum computer that has a tight timing tolerance. Thus, by generating the clock signals locally off of the excess pump photons from the phone-pair source 610 that resides on the same chip at the cryogenic temperature, as illustrated in FIG. 6, the undesirable phase errors and drifts may be prevented or reduced.

Figure 7:
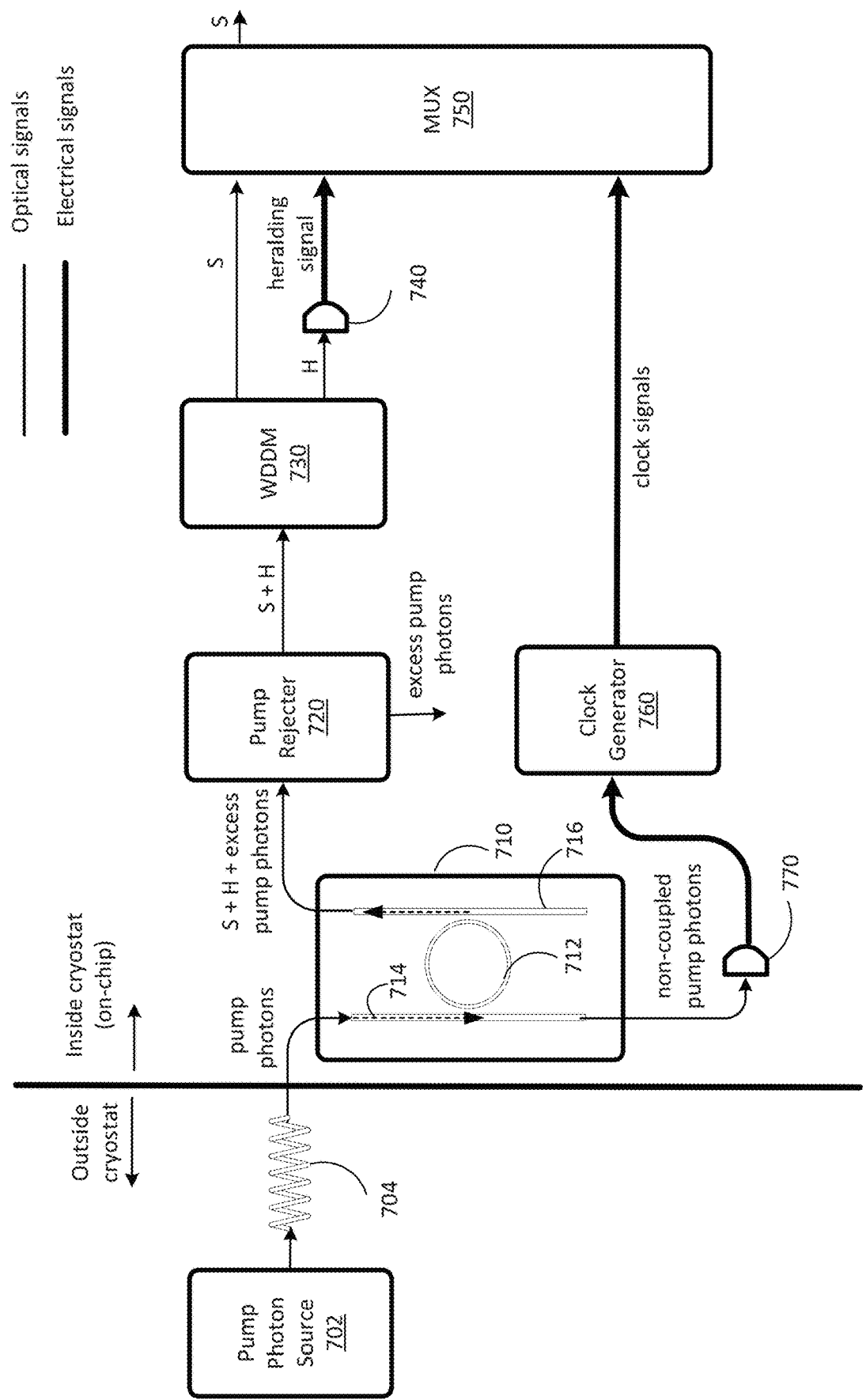
FIG. 7 a schematic block diagram of a system for generating clock signals for a photonic quantum computer according to some other embodiments.

FIG. 7 a schematic block diagram of a system for generating clock signals for a photonic quantum computer according to some other embodiments. Similar to the system illustrated in FIG. 6, this system may include a pump photon source 702 that resides at room temperature outside a cryostat, and a photon-pair source 710 that resides inside the cryostat. The photon-pair source 710 is coupled to the pump photon source 702 via a waveguide 704.

Similar to the photon-pair source 610, the photon-pair source 710 may include a first waveguide 714, a resonator 712 optically coupled to the first waveguide 714, and a second waveguide 716 optically coupled to the resonator 712. A portion of the pump photons may be coupled from the first waveguide 714 into the resonator 712, while a remaining portion of the pump photons may exit the first waveguide 714 as non-coupled pump photons. The resonator 712 may convert some of the pump photons into pairs of signal photon and heralding photon. The converted photon pairs, as well as the excess pump photons that are not converted, may be coupled into the second waveguide 716 as output.

The output of the photon-pair source 710 may be coupled into a pump rejecter 720. The pump rejecter 720 separates the signal photon (S) and the heralding photon (H) from the excess pump photons, for example via spectral filtering. The excess pump photons may be absorbed by a beam dump (not shown). The signal photon and the heralding photon are in turn separated by a wavelength division demultiplexing (WDDM) device 730. The heralding photon may be detected by a single-photon detector 740, which generates an electrical heralding signal. The heralding signal can be used by a multiplexer 750 for multiplexing signal photons generated by a plurality of photon-pair sources.

The system may further include a photodetector 770 coupled to a clock generator 760. Here, instead of taking the excess pump photons rejected by the pump rejecter 720 as input, the photodetector 770 takes the non-coupled pump photons from the first waveguide 714 of the photon-pair source 710 as input, and generates electrical pulses to be input into the clock generator 760. Because the photon-pair source 710 is placed on the chip inside a cryostat, the clock signals generated in this way may also be in synch with the phases of the single photons generated by the single-photon source, and the undesirable phase errors and drifts may be prevented or reduced.

Figure 8:
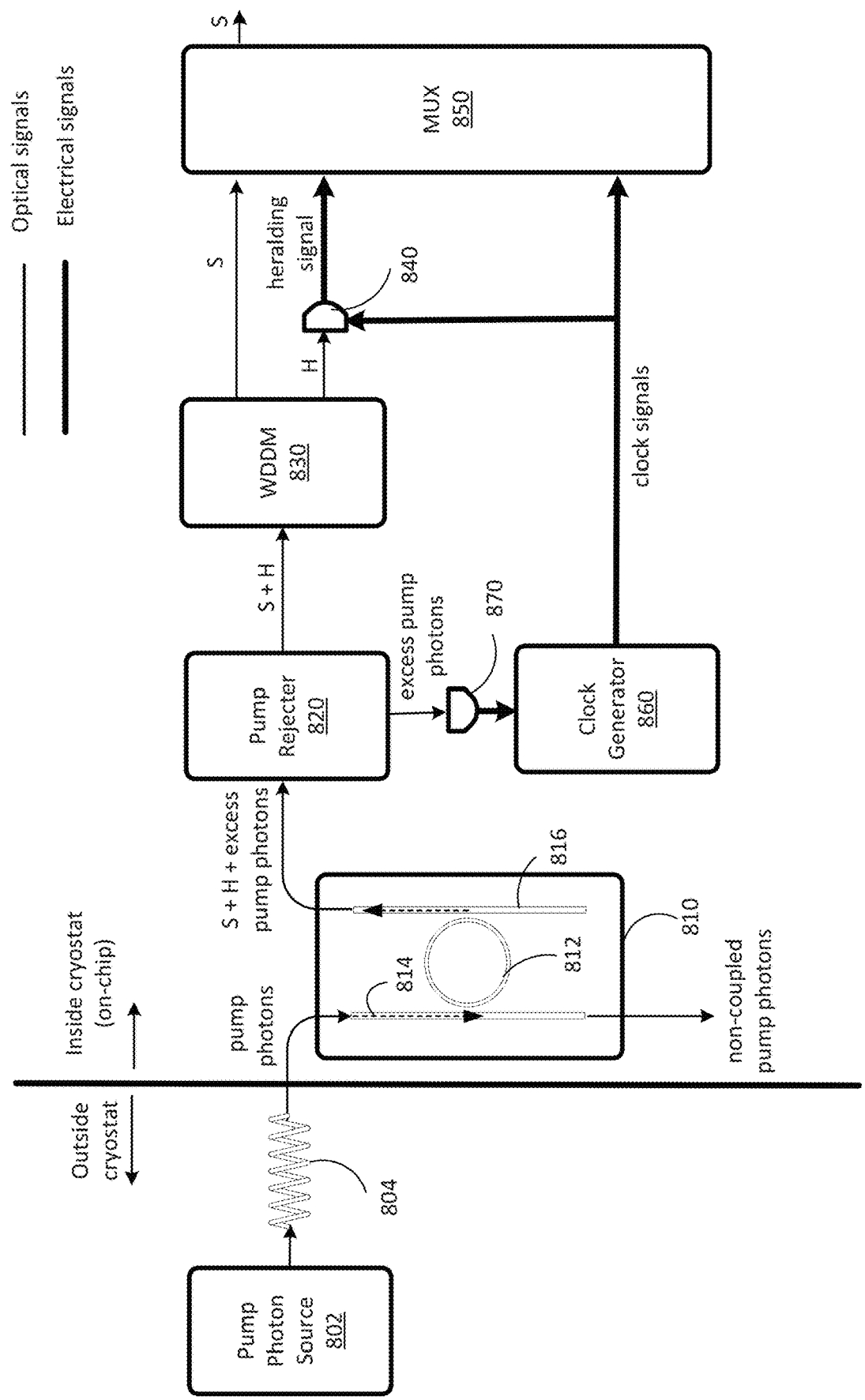
FIG. 8 a schematic block diagram of an alternative system for generating clock signals for use by a single photon detector according to some embodiments.

FIG. 8 a schematic block diagram of an alternative system for generating clock signals for use by a single photon detector according to some embodiments. Similar to the system illustrated in FIG. 6, this system may include a pump photon source 802 that resides at room temperature outside a cryostat, and a photon-pair source 810 that resides inside the cryostat. The photon-pair source 810 is coupled to the pump photon source 802 via a waveguide 804.

Similar to the photon-pair source 610, the photon-pair source 810 may include a first waveguide 814, a resonator 812 optically coupled to the first waveguide 814, and a second waveguide 816 optically coupled to the resonator 812. A portion of the pump photons may be coupled from the first waveguide 814 into the resonator 812, while a remaining portion of the pump photons may exit the first waveguide 814 as non-coupled pump photons. The resonator 812 may convert some of the pump photons into pairs of signal photon and heralding photon. The converted photon pairs, as well as the excess pump photons that are not converted, may be coupled into the second waveguide 816 as output.

The output of the photon-pair source 810 may be coupled into a pump rejecter 820. The pump rejecter 820 separates the signal photon (S) and the heralding photon (H) from the excess pump photons, for example via spectral filtering. The excess pump photons may be absorbed by a beam dump (not shown). The signal photon and the heralding photon are in turn separated by a wavelength division demultiplexing (WDDM) device 830. The heralding photon may be detected by a single-photon detector 840, which generates an electrical heralding signal. The heralding signal can be used by a multiplexer 850 for multiplexing signal photons generated by a plurality of photon-pair sources.

The system may further include a photodetector 870 and a clock generator 860. The photodetector 870 is optically coupled to the pump rejecter 820 for receiving the excess pump photons rejected by the pump rejecter 820. The photodetector 870 may convert the excess pump photons into electrical pulses. The electrical pulses are in turn input into the clock generator 860, which generates clock signals from the electrical pulses. In some embodiments, the clock generator 860 may include an optoelectronic amplifier that amplifies the electrical pulses generated by the photodetector 870 to generate the clock signals.

The clock signals may be input to the multiplexer 850 for controlling the operations of the multiplexer 850. For example, the clock signals may be used to control the timing of multiplexing. The clock signals may also be input to the single-photon detector 840 for controlling the operation of the single-photon detector 840. For example, the clock signals may be used to control when the single-photon detector 840 should be turned on and off. The single-photon detector 840 may be susceptible to spurious noise in the environment. For example, a superconducting nanowire single-photon detector is a very sensitive device and may generate dark counts in the absence of a detected photon. Thus, it may be helpful to turn on the single-photon detector 840 only at time intervals at which a photon may be expected.

Figure 9:
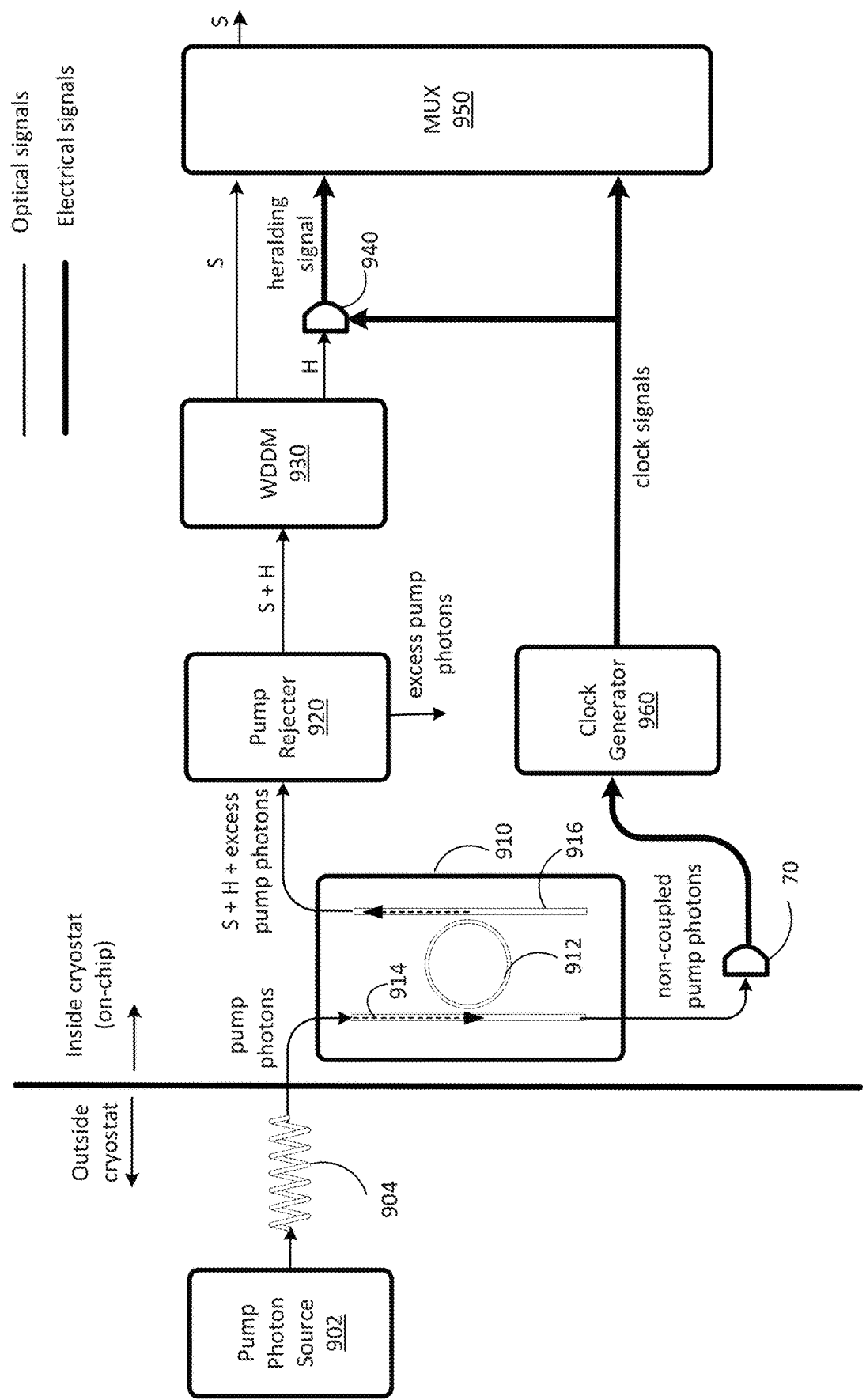
FIG. 9 a schematic block diagram of an alternative system for generating clock signals for use by a single photon detector according to some other embodiments.

FIG. 9 a schematic block diagram of an alternative system for generating clock signals for use by a single photon detector according to some other embodiments. Similar to the system illustrated in FIG. 8, this system may include a pump photon source 902 that resides at room temperature outside a cryostat, and a photon-pair source 910 that resides inside the cryostat. The photon-pair source 910 is coupled to the pump photon source 902 via a waveguide 904.

Similar to the photon-pair source 810, the photon-pair source 910 may include a first waveguide 914, a resonator 912 optically coupled to the first waveguide 914, and a second waveguide 916 optically coupled to the resonator 912. A portion of the pump photons may be coupled from the first waveguide 914 into the resonator 912, while a remaining portion of the pump photons may exit the first waveguide 914 as non-coupled pump photons. The resonator 912 may convert some of the pump photons into pairs of signal photon and heralding photon. The converted photon pairs, as well as the excess pump photons that are not converted, may be coupled into the second waveguide 916 as output.

The output of the photon-pair source 910 may be coupled into a pump rejecter 920. The pump rejecter 920 separates the signal photon (S) and the heralding photon (H) from the excess pump photons, for example via spectral filtering. The excess pump photons may be absorbed by a beam dump (not shown). The signal photon and the heralding photon are in turn separated by a wavelength division demultiplexing (WDDM) device 930. The heralding photon may be detected by a single-photon detector 940, which generates an electrical heralding signal. The heralding signal can be used by a multiplexer 950 for multiplexing signal photons generated by a plurality of photon-pair sources.

The system may further include a photodetector 970 and a clock generator 960. Here, instead of taking the excess pump photons rejected by the pump rejecter 920 as input, the photodetector 970 takes the non-coupled pump photons from the first waveguide 914 of the photon-pair source 910 as input, and generates electrical pulses to be input into the clock generator 960. Because the photon-pair source 910 is placed on the chip inside a cryostat, the clock signals generated in this way may also be in synch with the phases of the single photons generated by the single-photon source, and the undesirable phase errors and drifts may be prevented or reduced.

The clock signals may be input to the multiplexer 950 for controlling the operations of the multiplexer 950. For example, the clock signals may be used to control the timing of multiplexing. The clock signals may also be input to the single-photon detector 940 for controlling the operation of the single-photon detector 940. For example, the clock signals may be used to control when the single-photon detector 940 should be turned on and off.

Figure 10:
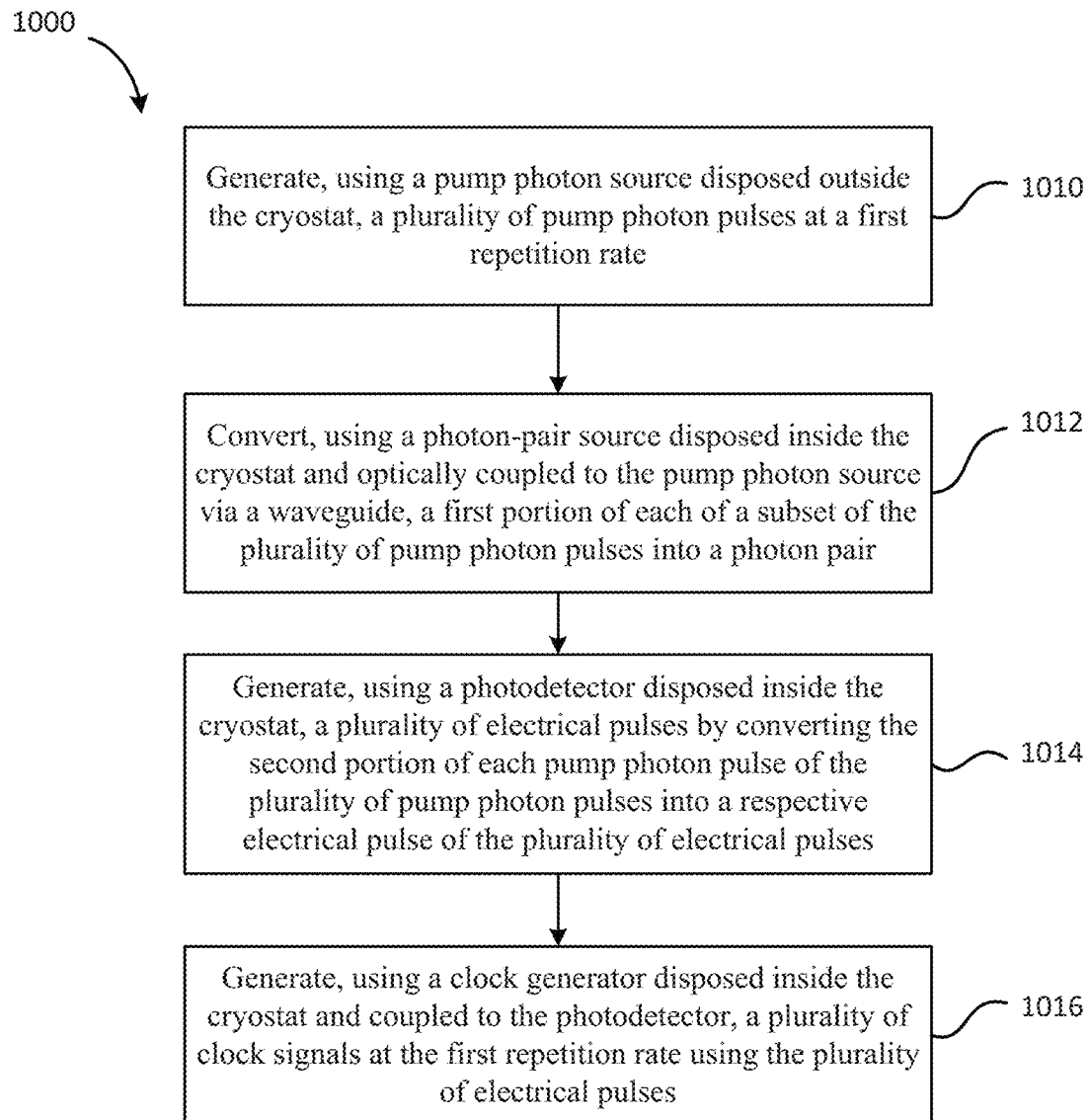
FIG. 10 shows a simplified flowchart illustrating a method for generating clock signals for a photonic quantum computing system according to some embodiments.

FIG. 10 shows a simplified flowchart illustrating a method for generating clock signals for a photonic quantum computing system according to some embodiments. As illustrated in FIG. 10, the method includes generating, using a pump photon source disposed outside the cryostat, a plurality of pump photon pulses at a first repetition rate (1010) and converting, using a photon-pair source disposed inside the cryostat and optically coupled to the pump photon source via a waveguide, a first portion of each of a subset of the plurality of pump photon pulses into a photon pair (1012). The photon-pair source outputs a second portion of each pump photon pulse of the plurality of pump photon pulses. The photon pair can include a signal photon and a heralding photon, and one of the signal photon or the heralding photon is used by the quantum computing system as a qubit. The first portion of each of the subset of the plurality of pump photon pulses can be converted into the photon pair non-deterministically.

The method also includes generating, using a photodetector disposed inside the cryostat, a plurality of electrical pulses by converting the second portion of each pump photon pulse of the plurality of pump photon pulses into a respective electrical pulse of the plurality of electrical pulses (1014) and generating, using a clock generator disposed inside the cryostat and coupled to the photodetector, a plurality of clock signals at the first repetition rate using the plurality of electrical pulses (1016).

In an embodiment, the photon-pair source, the photodetector, the clock generator, and the photonic quantum computing system are disposed on a single chip placed inside the cryostat. The photon-pair source can include a first waveguide optically coupled to the pump photon source via the waveguide for receiving the plurality of pump photon pulses, a resonator optically coupled to the first waveguide and comprising a nonlinear optical material, and a second waveguide optically coupled to the resonator. The method can further include coupling a portion of each pump photon pulse of the plurality of pump photon pulses from the first waveguide into the resonator. The first portion of each of the subset of the plurality of pump photon pulses that is converted into the photon pair is among the portion and is converted by the nonlinear optical material of the resonator.

The method can further include coupling the photon pairs converted from the subset of the plurality of pump photon pulses by the resonator into the second waveguide. As an example, the resonator can include one or more ring resonators. In a particular embodiment, the second portion of each pump photon pulse of the plurality of pump photon pulses is among the portion and the method further comprises coupling the second portion of each pump photon pulse of the plurality of pump photon pulses from the resonator into the second waveguide. In another particular embodiment, the method includes separating, using a pump rejecter disposed inside the cryostat and optically coupled to the second waveguide, the second portion of each pump photon pulse of the plurality of pump photon pulses from the photon pairs and coupling the second portion of each pump photon pulse of the plurality of pump photon pulses into the photodetector to be converted into the plurality of electrical pulses. In one embodiment, the pump rejecter comprises a spectral filter.

The second portion of each pump photon pulse of the plurality of pump photon pulses can be among a remaining portion of each pump photon pulse of the plurality of pump photon pulses that is not coupled into the resonator. Accordingly, the method can include coupling the second portion of each pump photon pulse of the plurality of pump photon pulses from the first waveguide into the photodetector to be converted into the plurality of electrical pulses.

It should be appreciated that the specific steps illustrated in FIG. 10 provide a particular method for generating clock signals for a photonic quantum computing system according to some embodiments. Other sequences of steps may also be performed according to alternative embodiments. For example, alternative embodiments may perform the steps in a different order. Moreover, the individual steps may include multiple sub-steps that may be performed in various sequences as appropriate to the individual step. Furthermore, additional steps may be added and some steps may be removed depending on the particular applications. One of ordinary skill in the art would recognize many variations, modifications, and alternatives.

It will be apparent to those skilled in the art that substantial variations may be made in accordance with specific implementations. For example, customized hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The terms "machine-readable medium" and "computer-readable medium" as used herein refer to any storage medium that participates in providing data that causes a machine to operate in a specific fashion. In embodiments provided hereinabove, various machine-readable media might be involved in providing instructions/code to processors and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media, punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code.

The methods, systems, and devices discussed herein are examples. Various embodiments may omit, substitute, or add various procedures or components as appropriate. For instance, features described with respect to certain embodiments may be combined in various other embodiments. Different aspects and elements of the embodiments may be combined in a similar manner. The various components of the figures provided herein can be embodied in hardware and/or software. Also, technology evolves and, thus, many of the elements are examples that do not limit the scope of the disclosure to those specific examples.

It has proven convenient at times, principally for reasons of common usage, to refer to such signals as bits, information, values, elements, symbols, characters, variables, terms, numbers, numerals, or the like. It should be understood, however, that all of these or similar terms are to be associated with appropriate physical quantities and are merely convenient labels. Unless specifically stated otherwise, as is apparent from the discussion above, it is appreciated that throughout this specification discussions utilizing terms such as "processing," "computing," "calculating," "determining," "ascertaining," "identifying," "associating," "measuring," "performing," or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic, electrical, or magnetic quantities within memories, registers, or other information storage devices, transmission devices, or display devices of the special purpose computer or similar special purpose electronic computing device.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In some implementations, operations or processing may involve physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining," or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

For an implementation involving firmware and/or software, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable storage medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, compact disc read-only memory (CD-ROM) or other optical disk storage, magnetic disk storage, semiconductor storage, or other storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer-readable storage medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims. That is, the communication apparatus includes transmission media with signals indicative of information to perform disclosed functions. At a first time, the transmission media included in the communication apparatus may include a first portion of the information to perform the disclosed functions, while at a second time the transmission media included in the communication apparatus may include a second portion of the information to perform the disclosed functions.

What is claimed is:

1. A system for generating clock signals for a photonic quantum computing system, the system comprising:
   a pump photon source configured to generate a plurality of pump photon pulses at a first repetition rate;
   a photon-pair source optically coupled to the pump photon source, the photon-pair source configured to:
   convert a subset of the plurality of pump photon pulses into photon pairs;
   output the photon pairs; and
   output a portion of each pump photon pulse of the plurality of pump photon pulses;
   a photodetector optically coupled to the photon-pair source and configured to:
   receive the portion of each pump photon pulse of the plurality of pump photon pulses; and
   converting the portion of each pump photon pulse of the plurality of pump photon pulses into a respective electrical pulse of a plurality of electrical pulses; and
   a clock generator electrically coupled to the photodetector and configured to convert the plurality of electrical pulses into a plurality of clock signals at the first repetition rate.

2. The system of claim 1 wherein the photon-pair source, the photodetector, the clock generator, and the photonic quantum computing system are disposed inside a cryostat and the pump photon source is disposed outside the cryostat.

3. The system of claim 1 wherein each of the photon pairs comprises a signal photon and a heralding photon, and one of the signal photon or the heralding photon is used by the photonic quantum computing system as a qubit.

4. The system of claim 1 further comprising a waveguide optically coupled to the pump photon source and the photon-pair source.

5. The system of claim 1 wherein each of the photon pairs comprises a signal photon and a heralding photon, and one of the signal photon or the heralding photon is used by the photonic quantum computing system as a qubit.

6. A system comprising:
a pump photon source;
a photon-pair source optically coupled to the pump photon source, wherein the photon-pair source is configured to:
  receive a plurality of pump photon pulses from the pump photon source;
  convert a first portion of the plurality of pump photon pulses into a photon pair;
  output the photon pair; and
  output a second portion of the plurality of pump photon pulses; and
a photodetector optically coupled to the photon-pair source and configured to generate a plurality of electrical pulses in response to detection of at least a portion of the plurality of pump photon pulses.

7. The system of claim 6 further comprising a clock generator coupled to the photodetector, the clock generator configured to convert the plurality of electrical pulses into a plurality of clock signals for a photonic quantum computing system.

8. The system of claim 7 wherein the photon-pair source and the photodetector are implemented in a photonic integrated circuit (PIC) and the clock generator is implemented in an electronic integrated circuit (EIC).

9. The system of claim 8 wherein the PIC and EIC are fusion bonded.

10. The system of claim 7 wherein the photon-pair source, the photodetector, and the clock generator are implemented on a same substrate structure.

11. The system of claim 10 wherein the same substrate structure comprises a fused PIC and EIC.

12. The system of claim 7 wherein the photon-pair source, the photodetector, the clock generator, and the photonic quantum computing system are disposed on a single chip disposed inside a cryostat.

13. The system of claim 12 wherein the pump photon source is disposed outside the cryostat.

14. The system of claim 6 wherein the photon pair comprises a signal photon and a heralding photon, and one of the signal photon or the heralding photon is used by a quantum computing system as a qubit.

15. The system of claim 6 wherein the photon-pair source converts the first portion of the plurality of pump photon pulses into the photon pair non-deterministically.

16. The system of claim 6 wherein the photon-pair source comprises:
  a first waveguide for receiving the plurality of pump photon pulses generated by the pump photon source;
  a resonator optically coupled to the first waveguide so that a portion of each pump photon pulse of the plurality of pump photon pulses is coupled into the resonator, the resonator comprising a nonlinear optical material for converting the first portion of the plurality of pump photon pulses into the photon pair; and
  a second waveguide optically coupled to the resonator so that the photon pair converted from the plurality of pump photon pulses are coupled thereto.

17. The system of claim 16 wherein the resonator comprises one or more ring resonators.

18. The system of claim 16 wherein the second portion of the plurality of pump photon pulses is coupled into the second waveguide and output by the second waveguide.

19. The system of claim 18 further comprising a pump rejecter optically coupled to the second waveguide of the photon-pair source, the pump rejecter configured to:
  receive the photon pair and the second portion of the plurality of pump photon pulses;
  output the photon pair through a first output port; and
  output the second portion of the plurality of pump photon pulses through a second output port optically coupled to the photodetector.

20. The system of claim 19 wherein the pump rejecter comprises a spectral filter.

* * * * *